US009703298B2

(12) United States Patent
Sato

(10) Patent No.: US 9,703,298 B2
(45) Date of Patent: Jul. 11, 2017

(54) INFORMATION PROCESSING APPARATUS, METHOD FOR CONTROLLING THE SAME AND PROGRAM

(71) Applicant: CANON KABUSHIKI KAISHA, Tokyo (JP)

(72) Inventor: Yoshikazu Sato, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 522 days.

(21) Appl. No.: 14/374,506

(22) PCT Filed: Oct. 30, 2013

(86) PCT No.: PCT/JP2013/080058
§ 371 (c)(1),
(2) Date: Jul. 24, 2014

(87) PCT Pub. No.: WO2014/073584
PCT Pub. Date: May 15, 2014

(65) Prior Publication Data
US 2014/0371945 A1  Dec. 18, 2014

(30) Foreign Application Priority Data
Nov. 7, 2012  (JP) .................. 2012-245635

(51) Int. Cl.
*G11C 11/406* (2006.01)
*G05D 23/19* (2006.01)
*G05B 15/02* (2006.01)

(52) U.S. Cl.
CPC ............. *G05D 23/19* (2013.01); *G05B 15/02* (2013.01); *G11C 11/40611* (2013.01); *G11C 11/40626* (2013.01)

(58) Field of Classification Search
None
See application file for complete search history.

(56) References Cited

U.S. PATENT DOCUMENTS 5,784,328 A * 7/1998 Irrinki ................ G11C 7/04
                                                     365/149
5,995,718 A   11/1999 Hiraike et al.
(Continued)

*Primary Examiner* — Isaac T Tecklu
(74) *Attorney, Agent, or Firm* — Fitzpatrick, Cella, Harper & Scinto

(57) ABSTRACT

An information processing apparatus according to an aspect of the present invention generates temperature distribution information (updated temperature information) that indicates the current temperature distribution in a memory chip, based on predetermined temperature information generated by an analysis executed in advance and temperature information obtained by a temperature sensor. The predetermined temperature information includes information related to the temperature distribution in the memory chip that corresponds to the operating states of an SoC die and a wide IO memory device. The information processing apparatus sets a thermal offset value to be used in the refresh operation of the memory chip, according to the difference between the temperature at the location of the temperature sensor and the temperature at a hotspot in the memory chip, which are included in the temperature distribution indicated by the updated temperature information.

18 Claims, 16 Drawing Sheets

(56) References Cited

U.S. PATENT DOCUMENTS

| | | | |
|---|---|---|---|
| 2006/0006166 A1* | 1/2006 | Chen | G05D 23/1931 219/494 |
| 2006/0236027 A1* | 10/2006 | Jain | G11C 7/04 711/106 |
| 2006/0280012 A1* | 12/2006 | Perner | G11C 7/04 365/212 |
| 2007/0043522 A1* | 2/2007 | Kobayashi | G01K 7/00 702/57 |
| 2007/0213882 A1* | 9/2007 | Inukai | G05D 23/1931 700/300 |
| 2007/0247944 A1* | 10/2007 | Fischer | G11C 7/04 365/212 |
| 2007/0271409 A1* | 11/2007 | Miura | G06F 12/0623 711/5 |
| 2008/0284609 A1* | 11/2008 | Rofougaran | G01K 1/024 340/584 |
| 2008/0285633 A1* | 11/2008 | Rofougaran | H04Q 9/00 375/219 |
| 2009/0168840 A1* | 7/2009 | Song | G01K 3/005 374/170 |
| 2010/0201432 A1 | 8/2010 | Sugaya et al. | |
| 2012/0018885 A1 | 1/2012 | Lee et al. | |
| 2012/0099389 A1* | 4/2012 | Park | G11C 11/40618 365/200 |
| 2012/0163413 A1* | 6/2012 | Kim | G01K 7/01 374/152 |
| 2012/0263003 A1 | 10/2012 | Sakakibara et al. | |
| 2014/0140156 A1* | 5/2014 | Shoemaker | G11C 7/04 365/201 |
| 2014/0185403 A1* | 7/2014 | Lai | G11C 11/40626 365/222 |

* cited by examiner

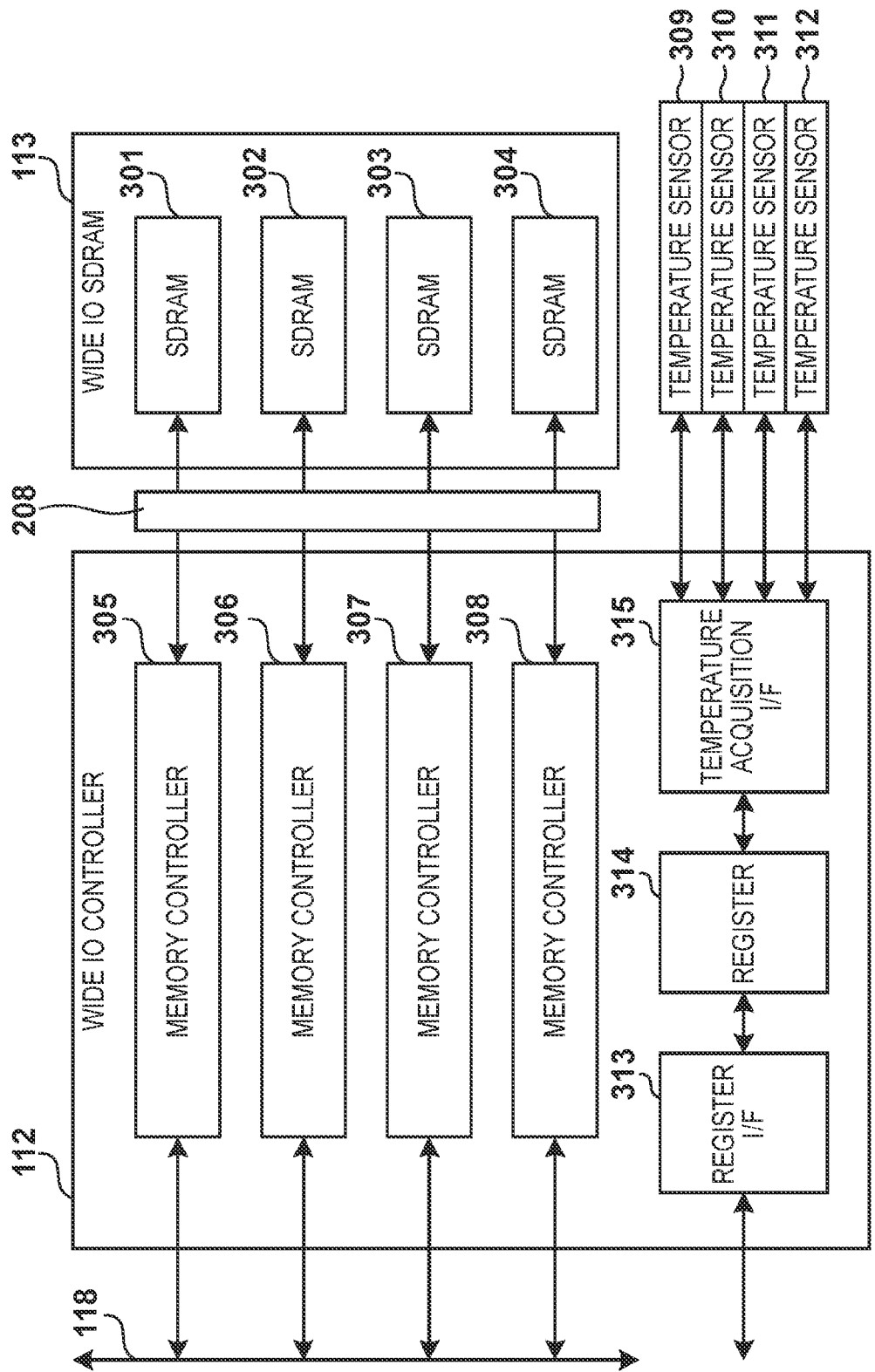

FIG. 6

|   | X | 0 | 1 | 2 | 3 | 4 | 5 | 6 | 7 |
|---|---|---|---|---|---|---|---|---|---|
| Y |   |   |   |   |   |   |   |   |   |
| 0 |   |   |   |   |   |   |   |   |   |
| 1 |   |   |   |   |   |   |   |   |   |
| 2 |   |   |   |   |   |   |   |   |   |
| 3 |   |   |   |   |   |   |   |   |   |
| 4 |   |   |   |   |   |   |   |   |   |
| 5 |   |   |   |   |   |   |   |   |   |
| 6 |   |   |   |   |   |   |   |   |   |
| 7 |   |   |   |   |   |   |   |   |   |

| X | Y | C0 | C1 | C2 | C3 | C4 |
|---|---|----|----|----|----|----|
| 0 | 0 | 18 | 22 | 40 | 42 | 44 |
| 0 | 1 | 18 | 22 | 40 | 42 | 44 |
| 0 | 2 | 18 | 24 | 42 | 44 | 46 |
| 0 | 3 | 18 | 24 | 42 | 44 | 46 |
| ⋮ | ⋮ | ⋮ | ⋮ | ⋮ | ⋮ | ⋮ |
| 4 | 3 | 18 | 24 | 54 | 56 | 60 |
| 4 | 4 | 18 | 24 | 54 | 56 | 60 |
| 4 | 5 | 18 | 26 | 58 | 60 | 62 |
| 4 | 6 | 18 | 26 | 60 | 62 | 64 |
| ⋮ | ⋮ | ⋮ | ⋮ | ⋮ | ⋮ | ⋮ |
| 7 | 4 | 18 | 34 | 62 | 66 | 70 |
| 7 | 5 | 18 | 36 | 62 | 66 | 70 |
| 7 | 6 | 18 | 40 | 64 | 70 | 72 |
| 7 | 7 | 18 | 46 | 70 | 74 | 76 |

(ENVIRONMENTAL TEMPERATURE = 25°C)

FIG. 7B

| X | Y | C0 | C1 | C2 | C3 | C4 |
|---|---|----|----|----|----|----|
| 0 | 0 | 18 | 24 | 54 | 56 | 56 |
| 0 | 1 | 18 | 24 | 54 | 56 | 56 |
| 0 | 2 | 18 | 24 | 56 | 56 | 58 |
| 0 | 3 | 18 | 24 | 56 | 56 | 58 |
| ⋮ | ⋮ | ⋮ | ⋮ | ⋮ | ⋮ | ⋮ |
| 4 | 3 | 18 | 40 | 66 | 66 | 68 |
| 4 | 4 | 18 | 40 | 66 | 68 | 70 |
| 4 | 5 | 18 | 40 | 66 | 68 | 70 |
| 4 | 6 | 18 | 38 | 60 | 64 | 68 |
| ⋮ | ⋮ | ⋮ | ⋮ | ⋮ | ⋮ | ⋮ |
| 7 | 4 | 18 | 24 | 54 | 56 | 58 |
| 7 | 5 | 18 | 24 | 54 | 56 | 58 |
| 7 | 6 | 18 | 24 | 54 | 56 | 56 |
| 7 | 7 | 18 | 24 | 54 | 54 | 56 |

(ENVIRONMENTAL TEMPERATURE = 25°C)

| X | Y | UPDATED TEMPERATURE |
|---|---|---|
| 0 | 0 | 34 |
| 0 | 1 | 34 |
| 0 | 2 | 36 |
| 0 | 3 | 36 |
| ⋮ | ⋮ | ⋮ |
| 4 | 3 | 47 |
| 4 | 4 | 47 |
| 4 | 5 | 48 |
| 4 | 6 | 48 |
| ⋮ | ⋮ | ⋮ |
| 7 | 4 | 56 |
| 7 | 5 | 57 |
| 7 | 6 | 57 |
| 7 | 7 | 60 |

F I G. 11
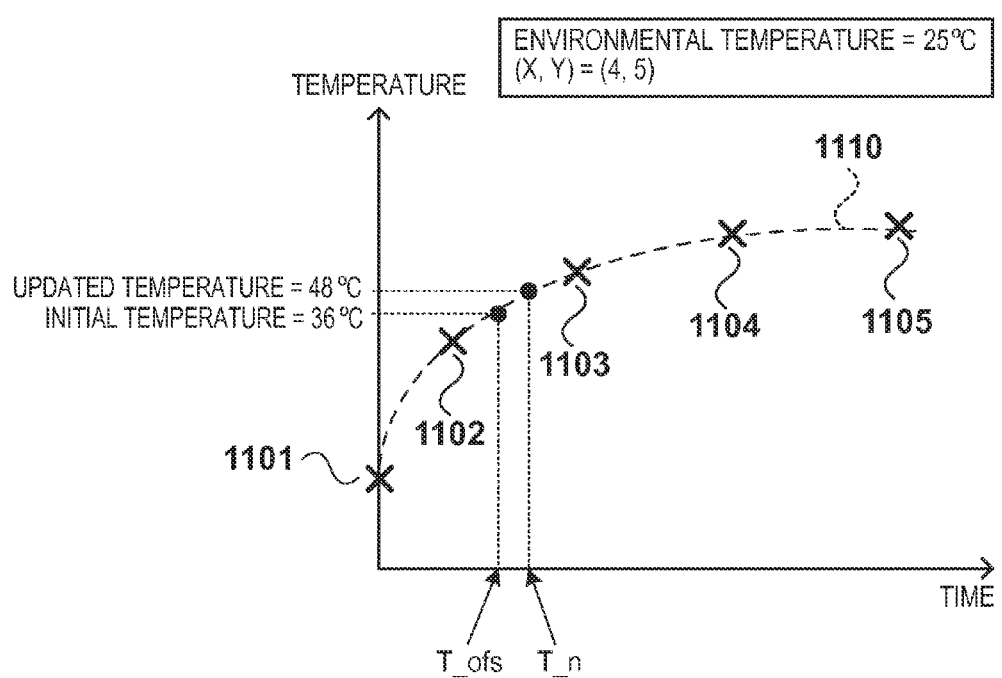

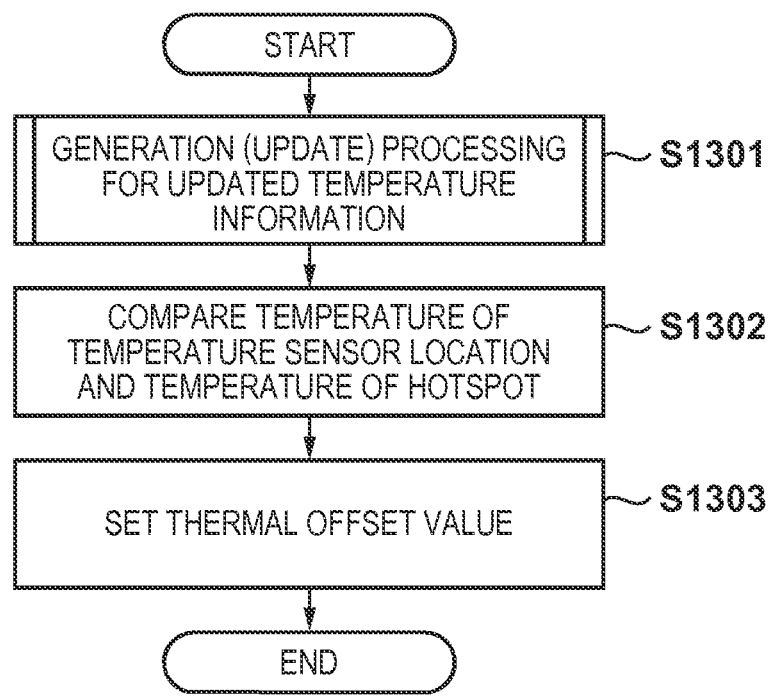

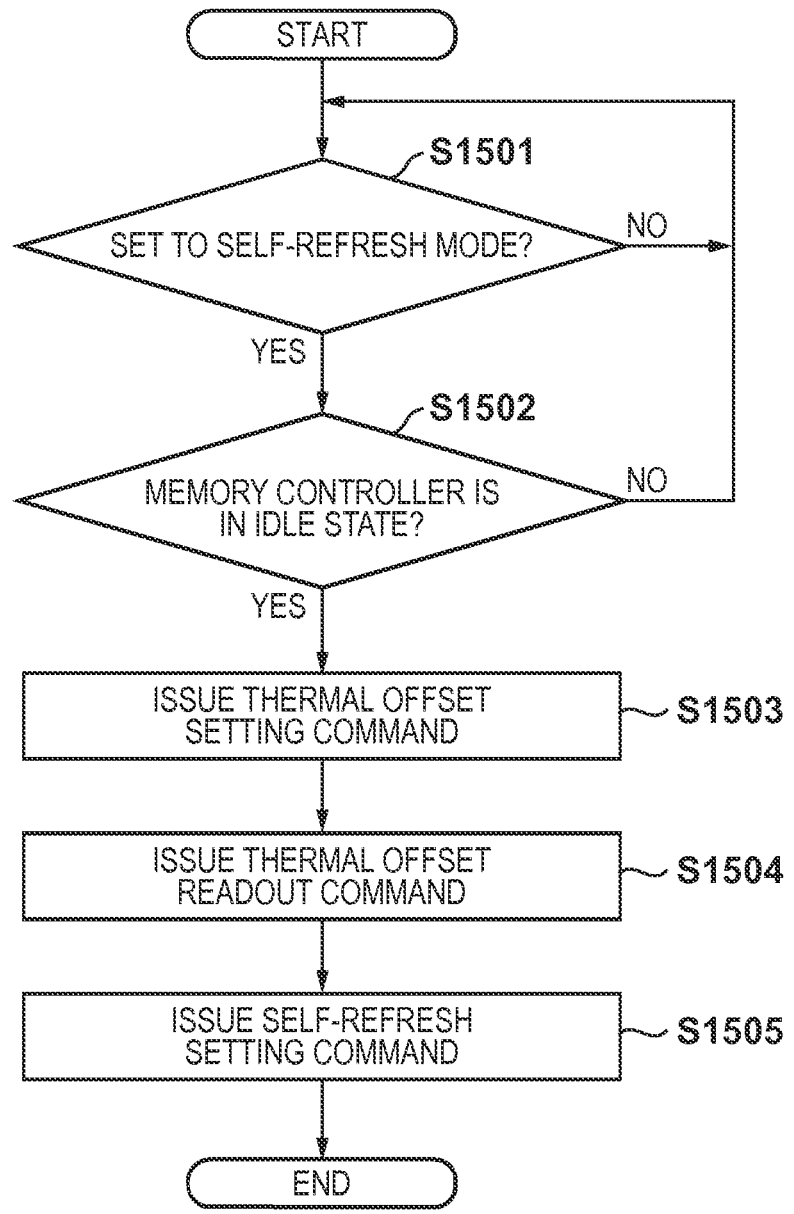

F I G. 16A
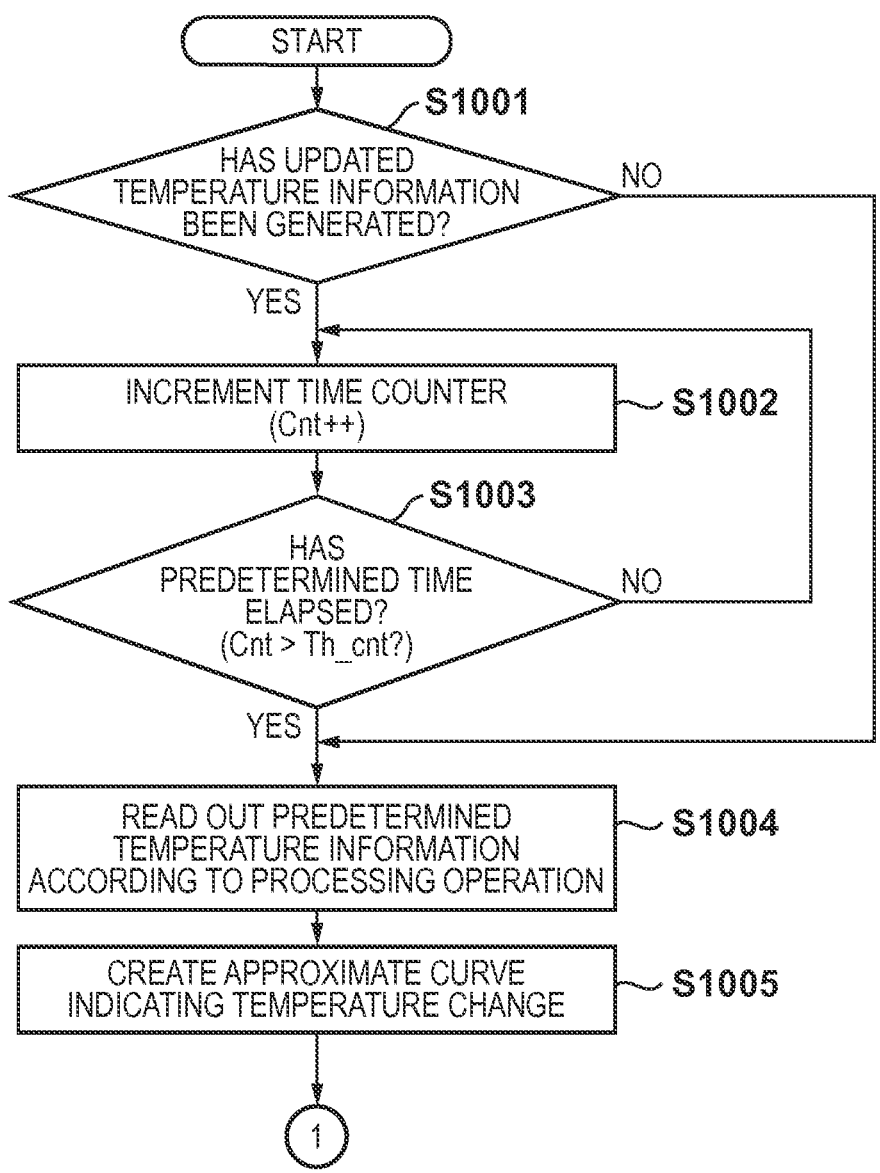

F I G. 18

| X | Y | TEMPERATURE SENSOR | UPDATED TEMPERATURE (PRE-CORRECTION) | UPDATED TEMPERATURE (POST-CORRECTION) | |
|---|---|---|---|---|---|
| 0 | 0 | – | 34 | 38 | |
| 0 | 1 | – | 34 | 38 | |
| 0 | 2 | – | 36 | 40 | |
| 0 | 3 | – | 36 | 40 | |
| ⋮ | | | | | |
| 4 | 3 | – | 47 | 51 | |
| 4 | 4 | – | 47 | 51 | |
| 4 | 5 | 52 | 48 | 52 | 1811 |
| 4 | 6 | – | 48 | 52 | |
| ⋮ | | | | | |
| 7 | 4 | – | 56 | 60 | |
| 7 | 5 | – | 57 | 61 | |
| 7 | 6 | – | 57 | 61 | |
| 7 | 7 | – | 60 | 64 | 1812 |

Columns: 1800, 1801, 1802

INFORMATION PROCESSING APPARATUS, METHOD FOR CONTROLLING THE SAME AND PROGRAM

TECHNICAL FIELD

The present invention relates to an information processing apparatus including a wide IO memory device stacked on an SoC die that includes a CPU.

BACKGROUND ART

In information processing apparatuses that include a CPU such as a microprocessor, a DRAM is often used for storage of data for executing an OS and various applications, and for temporary storage of data for executing image processing. The DRAM is connected to a CPU, an SoC (System on a Chip), or the like and used by them. Furthermore, in recent years, as functions have been added/enhanced in information processing apparatuses, the amount of memory bandwidth needed in DRAMs has increased. Because of this, the amount of memory bandwidth has been increased by raising the clock frequency during memory access, according to a standard such as DDR3 or DDR4. Furthermore, as another method, memory bandwidth is reserved by including multiple DRAM channels that are connected to a CPU or an ASIC (Application Specific Integrated Circuit). However, a new problem occurs in that increasing the clock frequency and employing multiple memory channels increases power consumption.

In view of this, wide IOs, which are a next-generation DRAM standard, are currently gaining attention. A wide IO is configured by placing a DRAM chip over an SoC die using a 3D stacking technique based on TSVs (Through-Silicon Vias). Features of the wide IO include being able to obtain a wide bandwidth that is over 12.8 GB/s (gigabytes per second) at most, with a wide data width of 512 bits, and having low power consumption due to the access frequency being suppressed to a low frequency. Also, by employing TSVs, the package size can be made thinner and smaller compared to a conventional PoP (Package on Package). Furthermore, in this configuration, a data width of 512 bits is divided into four 128-bit channels and each channel is controlled individually. For example, a method of use is possible in which channel 1 and channel 2 are put in a self-refresh state, while channel 3 and channel 4 are used for normal memory access, or the like. A basic structure and basic access method for such a wide IO is disclosed in US2012/0018885.

In the stacked structure of a wide IO, stacking chips in an SoC package causes structural susceptibility to heat, and therefore problems related to heat generation arise more often than with conventional DRAMs. As a countermeasure, it has become standard for the wide IO to build temperature sensors for detecting memory temperatures into chips, and the self-refresh rate can be controlled according to the temperatures detected by the temperature sensors.

Additionally, in a chip stacked in compliance with wide IO standards, the temperatures of locations at which temperatures are highest on the chip (hereinafter referred to as "hotspots") are higher than in the case of using a conventional chip. It is known that this increases the difference in temperature between the temperatures of hotspots and non-hotspots. Because of this, for example, in the case where a hotspot appears at a location that is different from the location of a temperature sensor on the chip, there is a possibility that a large difference will occur between the temperature detected by the temperature sensor and the temperature of the hotspot. As a result, in the case where the self-refresh rate has been set according to the temperature detected by the temperature sensor, there is a possibility that the hotspot will lead to the loss of content stored in the DRAM and an increase in power consumption.

In order to deal with this phenomenon, a value called a "thermal offset" that indicates a difference in temperature between hotspots and locations at which temperature sensors have been provided is defined as a standard. The thermal offset value is set in steps to match the difference in temperature between the hotspots and the locations at which temperature sensors are provided. By setting the self-refresh rate based on the thermal offset value that was set with this standard, self-refresh rate control giving consideration to this temperature difference is realized.

However, it is not easy to appropriately set the thermal offset by appropriately estimating the difference in temperature between temperatures of hotspots and temperatures detected by temperature sensors. This is because the locations and temperatures of the hotspots on the chip change moment by moment depending on the operating state of the wide IO memory device, which changes according to the state of memory access with respect to the wide IO memory device and the processing state of the SoC die. Because of this, it is necessary to appropriately set the thermal offset with consideration given to the operating state of the wide IO memory device.

SUMMARY OF INVENTION

The present invention has been provided in view of the aforementioned problems. One aspect of the present invention provides a technique for appropriately setting a thermal offset value giving consideration to the operating states of an SoC die and a wide IO memory device in the case of using the wide IO memory device in an information processing apparatus.

According to one aspect of the present invention, there is provided an information processing apparatus comprising: a wide IO memory device stacked on an SoC die that includes a CPU; acquisition means for acquiring, from a temperature sensor provided in a memory chip that is included in the wide IO memory device, sensor information that indicates a temperature of the memory chip at the location of the temperature sensor; generation means for generating temperature distribution information that indicates a current temperature distribution in the memory chip, based on the sensor information acquired by the acquisition means and predetermined temperature information that includes information that was generated using an analysis executed in advance and is related to the temperature distribution in the memory chip, the predetermined temperature information corresponding to operating states of the SoC die and the wide IO memory device; and setting means for setting a thermal offset value to be used for a refresh operation of the memory chip in accordance with a difference between the temperature at a location at which the temperature is the highest in the memory chip and the temperature at the location of the temperature sensor that are included in the temperature distribution indicated by the temperature distribution information.

According to another aspect of the present invention, there is provided a method for controlling an information processing apparatus including a wide IO memory device stacked on an SoC die that includes a CPU, the method comprising steps of: acquiring, from a temperature sensor provided in a memory chip that is included in the wide IO memory device, sensor information that indicates a temperature of the memory chip at the location of the temperature sensor; generating temperature distribution information indicating a current temperature distribution in the memory chip based on sensor information acquired in the acquiring step and predetermined temperature information that includes information that was generated using an analysis executed in advance and is related to the temperature distribution in the memory chip, the predetermined temperature information corresponding to operating states of the SoC die and the wide IO memory device; and setting a thermal offset value to be used for a refresh operation of the memory chip in accordance with a difference between the temperature at a location at which the temperature is the highest in the memory chip and the temperature at the location of the temperature sensor that are included in the temperature distribution indicated by the temperature distribution information.

According to an aspect of the present invention, it is possible to provide a technique for appropriately setting a thermal offset value giving consideration to the operating states of an SoC die and a wide IO memory device in the case of using the wide IO memory device in an information processing apparatus. Further features of the present invention will become apparent from the following description of exemplary embodiments (with reference to the attached drawings).

BRIEF DESCRIPTION OF DRAWINGS

FIG. 3 is a block diagram showing the internal configuration of a wide IO controller according to the first embodiment of the present invention.

FIG. 6 is a diagram showing an example of area division in a memory chip (SDRAM 301) according to the first embodiment of the present invention.

FIGS. 7A and 7B are diagrams showing examples of the content of predetermined temperature information used in the first embodiment of the present invention.

FIG. 11 is a diagram showing an example of an approximate curve created based on predetermined temperature information regarding an area in which a temperature sensor 309 is located.

FIG. 13 is a flowchart showing a procedure of processing for the CPU to set a thermal offset value in the MFP according to the first embodiment of the present invention.

FIG. 14 is a diagram showing an example of a relationship between the temperature difference that was derived in step S1302 and the thermal offset value that is to be set, which is used in the first embodiment of the present invention.

FIG. 15 is a flowchart showing a procedure of processing for the CPU to set a self-refresh mode in the MFP according to the first embodiment of the present invention.

FIGS. 16A and 16B are flowcharts showing a procedure of processing for the CPU to generate and update the updated temperature information in the MFP according to a second embodiment of the present invention.

FIG. 18 is a diagram showing an example of the content of updated temperature information before and after correction in step S1603 according to the second embodiment of the present invention.

DESCRIPTION OF EMBODIMENTS

Hereinafter, embodiments of the present invention will be described in detail with reference to the accompanying drawings. It should be noted that the following embodiments are not intended to limit the scope of the appended claims, and that not all the combinations of features described in the embodiments are necessarily essential to the solving means of the present invention.

An MFP (digital multi-function device) having multiple functions such as scanning, printing, and copying will be described in the embodiments below as an example of an information processing apparatus to which the present invention applies.

First Embodiment

<Configuration of MFP 100>

Figure 1:
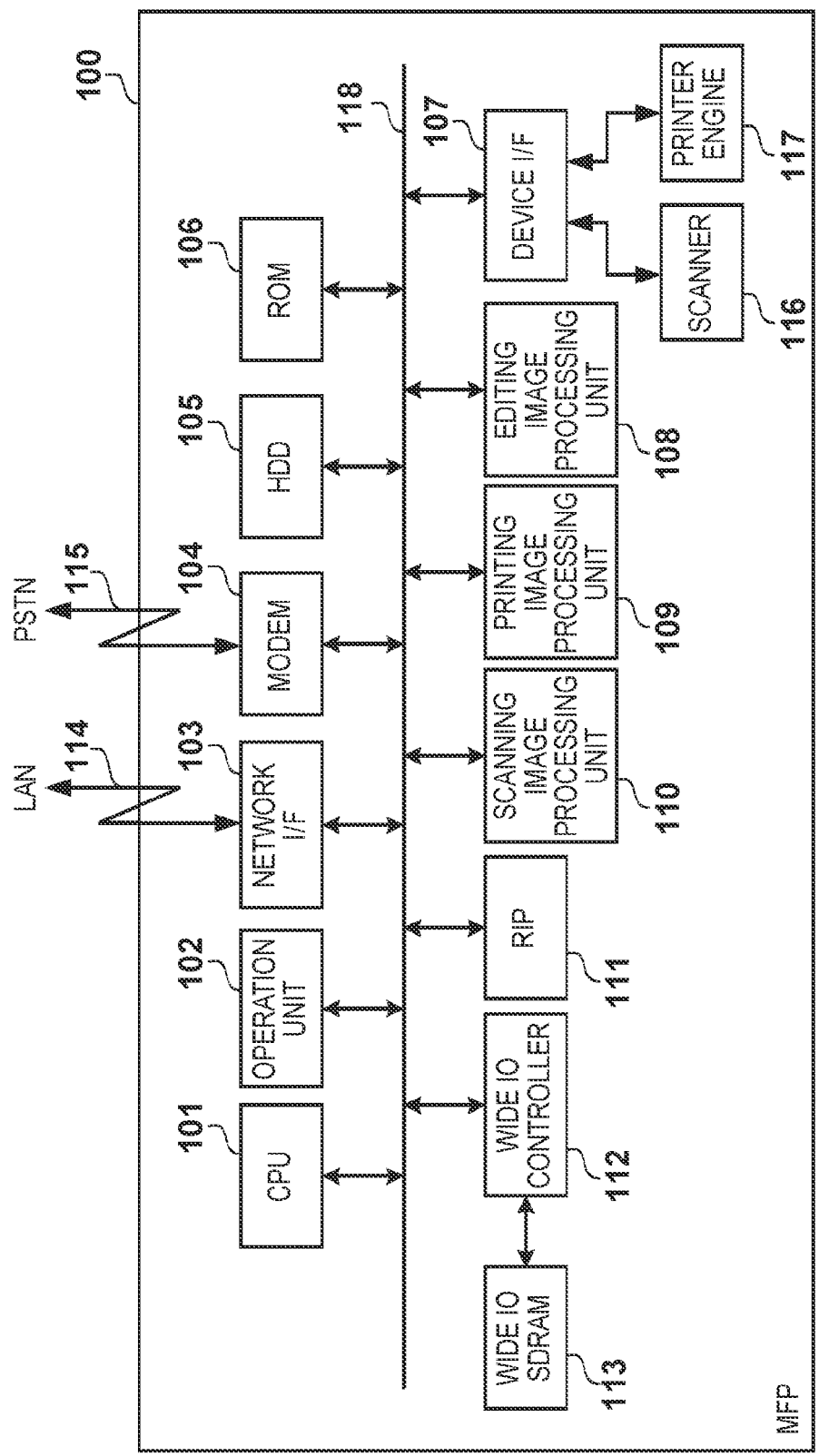
FIG. 1 is a block diagram showing an overall configuration of an MFP (a digital multifunction device) according to the first embodiment of the present invention.

FIG. 1 is a block diagram showing an overall configuration of an MFP (a digital multi-function device) according to the present embodiment.

An MFP 100 has a scanner 116 that is an image input device, and a printer engine 117 that is an image output device, and these are connected to a system bus 118 via a device interface (I/F) 107. The MFP 100 can perform scanning of an original image using the scanner 116, and printing using the printer engine 117, under control of the CPU 101. Also, the MFP 100 is connected to a LAN 114 and a public switched telephone network (PSTN) 115, and can input and output image data and device information regarding an external device connected to the LAN or the PSTN via the LAN 114 and the PSTN 115.

A CPU 101 controls the operation of this MFP 100 by executing a program loaded from an HDD 105 to a wide IO SDRAM 113 by a boot program stored in a ROM 106.

An operation unit 102 has an input unit such as a touch panel or a keyboard, and a display unit, and receives instructions from a user, and causes the display unit to display messages, processing results, and the like to the user. The network I/F 103 is realized by a LAN card for example, and performs input/output of device information and image data with external devices via the LAN 114. A modem 104 performs input/output of control information and image data with external devices via the PSTN 115. The HDD (hard disk drive) 105 stores an OS, various application programs, and the like, and holds input image data and the like. The ROM 106 stores a boot program and various data. The device I/F 107 is connected to the printer engine 117 and the scanner 116, and performs processing for image data transmission with the scanner 116, the printer engine 117, and the system bus 118.

As shown in FIG. 1, the MFP 100 includes image processing units 108 to 111 (an editing image processing unit 108, a printing image processing unit 109, a scanning image processing unit 110, and a RIP (Raster Image Processor) 111) for executing respective image processing functions. The editing image processing unit 108 performs, on image data, various types of image processing, such as rotation and size adjustment, color processing, trimming/masking, binary conversion, multi-value conversion, and blank sheet determination. The printing image processing unit 109 performs image processing and the like that corresponds to the printer engine 117 on image data to be output to the printer engine 117. The scanning image processing unit 110 performs various types of processing such as correcting, manipulating, and editing on image data input from the scanner 116. The RIP 111 renders page description language (PDL) code into image data. Note that in the present embodiment, the image processing units 108 to 111 are one example of multiple functional modules that each execute a separate function.

A wide IO controller 112 converts memory access commands from the CPU 101, the image processing units 108 to 110, and the like into commands that are interpretable by the wide IO SDRAM 113 and accesses the wide IO SDRAM 113. The wide IO SDRAM 113 stores programs to be executed by the CPU 101, and provides a system working memory for the CPU 101 to operate. Additionally, the wide IO-SDRAM 113 is also an image memory for temporarily storing input image data. As shown in FIG. 1, the system bus 118 connects the aforementioned devices and the CPU 101, and transfers control signals, data, and the like therebetween.

<Structure of wide IO SDRAM 113>

Figure 2A:
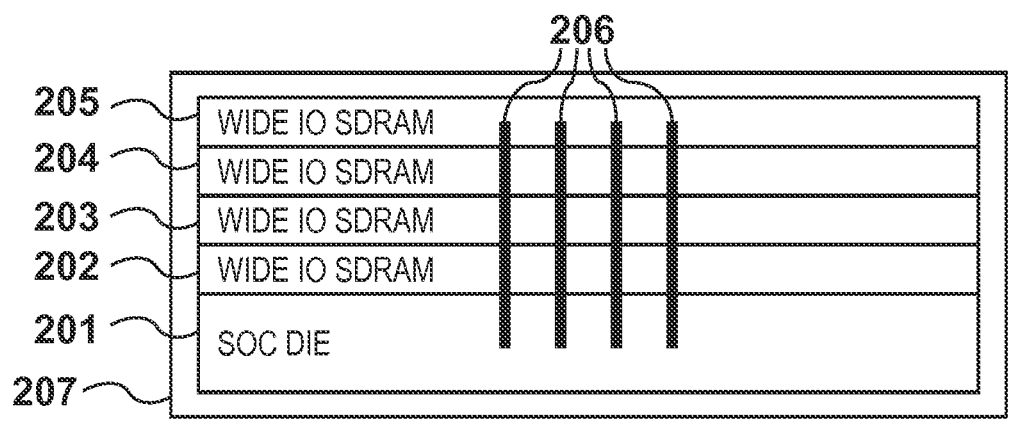
FIGS. 2A and 2B are pattern diagrams showing the structure of a wide IO SDRAM according to the first embodiment of the present invention.
Figure 2B:
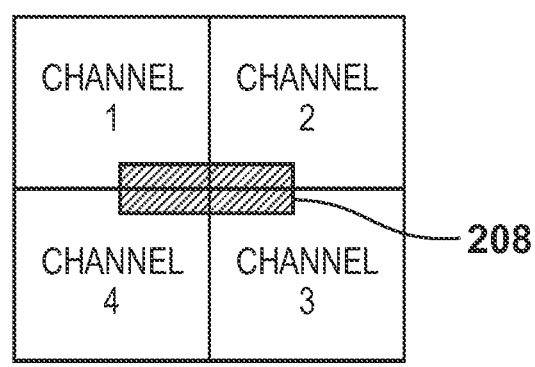

FIGS. 2A and 2B are pattern diagrams showing the structure of the wide IO SDRAM 113 according to the present embodiment, FIG. 2A being a side view of the wide IO SDRAM and an SoC die viewed from the side, and FIG. 2B being a top view.

In the present embodiment, an SoC die 201 includes the CPU 101, the device I/F 107, the image processing units 108 to 111, and the like. Wide IO SDRAM chips 202 to 205 are stacked over the SoC die 201 and connected to the SoC die 201 by a Through-Silicon Via (TSV) 206. The wide IO SDRAM chips can be stacked in four layers at most, according to the necessary memory capacity, and an example of stacking in four layers is shown in FIG. 2A. An SoC package 207 contains the SoC die 201 and the wide IO SDRAM chips 202 to 205 in one package. As shown in FIG. 2B, the wide IO SDRAM I/F 208 is arranged in the central portion of the SoC die 201 and the wide IO SDRAM chips 202 to 205.

<Configuration of Wide IO Controller 112>

FIG. 3 is a block diagram showing the internal configuration of the wide IO controller 112 according to the present embodiment.

In FIG. 3, the wide IO controller 112 is connected between the system bus 118 and the wide IO SDRAM 113, as shown in FIG. 1. The wide IO controller 112 is connected to temperature sensors 309 to 312, which are not illustrated in FIG. 1.

SDRAMs 301 to 304 are four memories provided in the wide IO SDRAM 113, and each includes a dedicated interface (I/F) as shown in FIG. 3. The dedicated I/Fs correspond to the four channels of the wide IO SDRAM chips 202 to 205, which are stacked over the SoC die 201 as described above. Also, the dedicated I/Fs correspond to the wide IO SDRAM I/F 208 in FIG. 2B. The memory controllers 305 to 308 can individually control power supply voltage, as well as the supply and termination of clock signals, for the SDRAMs 301 to 304. Each of the memory controllers 305 to 308 accesses a corresponding connected SDRAM by converting a memory access command from the system bus 118 into a command that is interpretable by the SDRAM. Note that the wide IO SDRAM 113 (SDRAMs 301 to 304) is an example of a wide IO memory device stacked over an SoC die that includes a CPU.

The temperature sensors 309 to 312 measure the temperature of the corresponding SDRAM out of the SDRAMs 301 to 304. A temperature acquisition I/F 315 acquires temperature information indicating the temperatures of the SDRAMs 301 to 304 from the temperature sensors 309 to 312.

Figure 4:
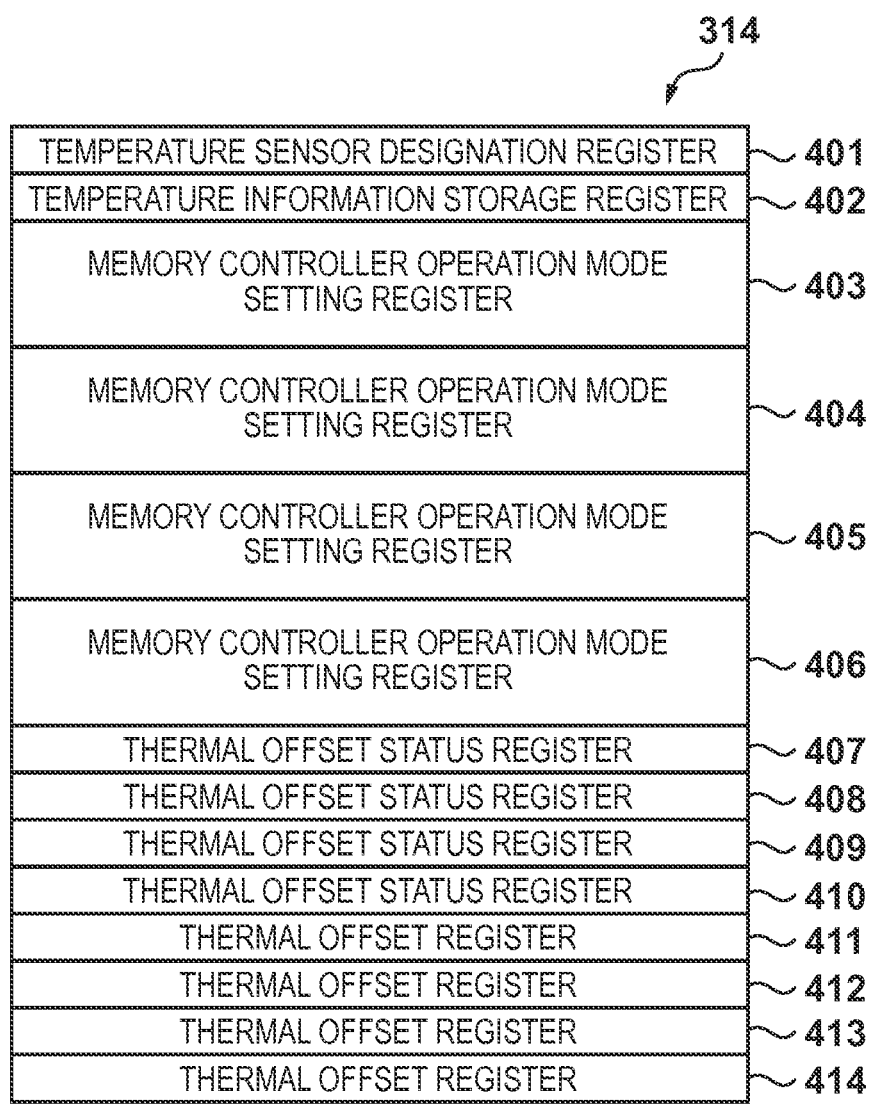
FIG. 4 is a diagram for describing a configuration of a register according to the first embodiment of the present invention.

A register I/F 313 receives access from the CPU 101 via a register-dedicated bus (not shown). A register 314 stores temperature information (sensor information) acquired by the temperature acquisition I/F 315 from the temperature sensors 309 to 312, as well as operation mode setting information for the memory controllers 305 to 308, which is set by the CPU 101. If the temperature acquisition I/F 315 detects a temperature information acquisition request from a temperature information storage register 402 (FIG. 4), which will be described later, the temperature acquisition I/F 315 issues a command for acquiring the temperature information to the temperature sensor designated by a later-described temperature sensor designation register 401 (FIG. 4). Thus, the temperature acquisition I/F 315 acquires the temperature information from the corresponding temperature sensor. The temperature acquisition I/F 315 outputs (stores) the acquired temperature information to the temperature information storage register 402 (described later).

<Configuration of Register 314 in Wide IO Controller 112>

FIG. 4 is a diagram for describing the configuration of the register 314 according to the present embodiment.

The register 314 has the temperature sensor designation register 401, the temperature information storage register 402, and memory controller operation mode setting registers 403 to 406. The register 314 further has thermal offset status registers 407 to 410 and thermal offset registers 411 to 414.

The temperature sensor designation register 401 is a register that stores information for designating a temperature sensor to be the target when the CPU 101 is to acquire the temperature information of a temperature sensor (sensor information). Since the present embodiment will be described using an example in which four temperature sensors are provided, it can be configured by a two-bit register, and can specify each of the four temperature sensors by the states of the two bits.

When a temperature information acquisition request from the CPU 101 is input, the temperature information storage register 402 makes a request to the temperature acquisition I/F 315 to acquire the temperature information of the temperature sensor designated by the temperature sensor designation register 401. Also, the temperature information storage register 402 stores temperature information acquired from the temperature acquisition I/F 315, and outputs the temperature information stored therein in accordance with a temperature information readout request from the CPU 101.

The memory controller operation mode setting registers 403 to 406 are registers for setting the operation modes of the memory controllers 305 to 308 respectively. The memory controller operation mode setting registers 403 to 406 respectively store setting values related to memory control for the SDRAMs 301 to 304. Here, examples of setting values related to memory control include time intervals of refresh operations for the SDRAMs 301 to 304, timing parameters related to memory access (refresh cycle), and the like.

The thermal offset status registers 407 to 410 are registers for holding thermal offset values that have been set by the memory controllers 305 to 308 for the SDRAMs 301 to 304 respectively. Note that, as will be described later, the thermal offset values are used for the refresh operation of the SDRAMs 301 to 304. After setting the thermal offset values for the SDRAMs 301 to 304, the memory controllers 305 to 308 read out the set thermal offset values by performing read access for checking to the SDRAMs 301 to 304. The memory controllers 305 to 308 store the read-out thermal offset values in the thermal offset status registers 407 to 410 respectively. Note that write access from the CPU 101 to the thermal offset status registers 407 to 410 is disabled.

The thermal offset registers 411 to 414 are registers for holding thermal offset values that are to be newly set by the memory controllers 305 to 309 with respect to the SDRAMs 301 to 304. As will be described below, the CPU 101 decides on the thermal offset values to be newly set with respect to the SDRAMs 301 to 304 and sets the values that were decided on in the thermal offset registers 411 to 414.

<SoC Package 207 and Arrangement of Temperature Sensors 309 to 312>

Figure 5:
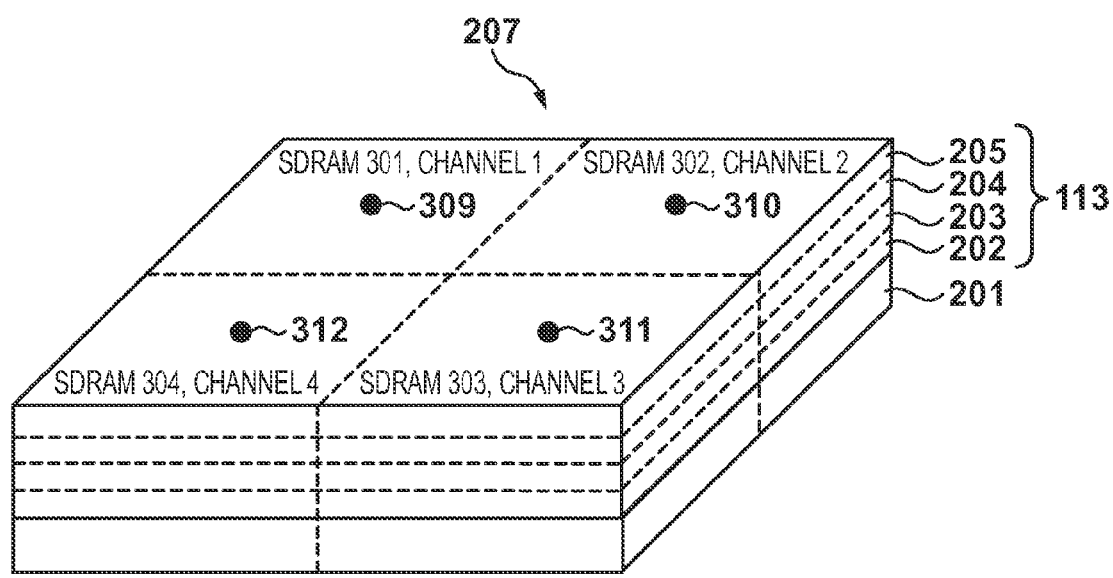
FIG. 5 is an overhead view of an SoC package according to the first embodiment of the present invention.

FIG. 5 is an overhead view of the SoC package 207 for simplifying the description of the physical positional relationships of the wide IO SDRAM chips 202 to 205 and the SoC die 201 in FIG. 2.

The SoC die 201 includes the CPU 101, the device I/F 107, the aforementioned image processing units 108 to 111, and the like. The memory channels 1 to 4 in FIG. 2B correspond to the upper left, upper right, bottom left, and bottom right portions of the plane of the SoC package 207. Also, the four portions similarly correspond to the SDRAMs 301 to 304 in FIG. 3. As described above, the wide IO SDRAM 113 is a memory stacked over the SoC die 201. Additionally, in the present embodiment, the devices in the SDRAMs 301 to 304 are stacked in four layers above the four portions of the SoC die 201, as shown in FIG. 5. The temperature sensors 309 to 312 are built into the devices in the SDRAMs 301 to 304 so that the internal temperature of each memory can be measured. However, this is merely an example, and the arrangement of the SDRAMs and the temperature sensors is not limited to FIG. 5. Also, the temperature sensors 309 to 312 may be provided within the SoC die 201, or they may be provided within the memory of the wide IO SDRAM 113.

In this way, as shown in FIG. 2B, the wide IO SDRAM chips (memory chips) 202 to 205 that are used in the present embodiment are divided into multiple chip areas (SDRAMs 301 to 304) that correspond to the memory channels 1 to 4 respectively. Also, the temperature sensors 309 to 312 are provided individually in the multiple chip areas.

<Content of Predetermined Temperature Information>

In the present embodiment, the CPU 101 generates temperature distribution information indicating the current temperature distribution in the memory chips with respect to the SDRAMs 301 to 304 and sets the thermal offset value used for each refresh operation based on the temperature distribution information that was generated. Specifically, the CPU 101 generates "temperature distribution information" that is used to set the thermal offset value, based on the temperature information (sensor information) acquired from the temperature sensors 309 to 312, and "predetermined temperature information" that was generated by an analysis performed in advance. The predetermined temperature information is information that is generated in advance for the SDRAMs 301 to 304 and includes the temperature distribution in the memory chips, and corresponds to the individual operating states of the SoC die 201 and the wide IO SDRAM 113. Note that the later-described "updated temperature information" is an example of temperature distribution information generated based on the sensor information and the predetermined temperature information.

Specific examples of the above-described predetermined temperature information will be described here. In the present embodiment, the distribution of temperatures in each area obtained by dividing the area in the planar memory chip into multiple areas is evaluated as a temperature distribution in the memory chips for each of the SDRAMs 301 to 304. FIG. 6 shows an example in which the (planar) entire area 600 of the SDRAM 301 is divided into eight areas in the X axis direction and divided into eight areas in the Y axis direction for a total of 64 areas. In the present embodiment, a case is presumed in which the entire areas 600 of each of the SDRAMs 301 to 304 are divided into 64 areas each, as shown in FIG. 6, and areas are specified with coordinates (X,Y) ((0,0) to (7,7)). Note that among the SDRAMs 301 to 304, mainly the SDRAM 301 will be described below, but the same follows for the SDRAMs 302 to 304.

FIGS. 7A and 7B are diagrams showing examples of the content of the predetermined temperature information used in the present embodiment. The predetermined temperature information used in the present embodiment is obtained by storing the temperature information indicating the temperature of predetermined locations on the SDRAM 301 (corresponding to the divided areas shown in FIG. 6) in a table format. The predetermined temperature information is generated by numeric value analysis such as heat simulation that is executed in advance during the designing and manufacturing of the SoC die 201, and is stored in advance in the HDD 105 or the ROM 106 before the MFP 100 is shipped. Note that FIGS. 7A and 7B show predetermined temperature information in the case where the environmental temperature is 25° C., but predetermined temperature information corresponding to a different environmental temperature may be generated in advance and made available.

The predetermined temperature information may be generated separately in advance for the SoC die 201 and the wide IO SDRAM 113 according to their individual operating states using numerical value analysis executed in advance. This is because the temperature distribution of the SDRAM 301 changes as a result of the status of memory access to the Wide IO SDRAM 113, which changes according to the operating state and operations of the SoC die 201, which change depending on operations executed by the MFP 100. By preparing the predetermined temperature information individually for multiple different processes executed by the MFP 100, it is possible to accurately estimate the change in temperature distribution in the SDRAM 301 according to the operating states of the SoC die 201 and the wide IO SDRAM 113.

With the above-mentioned numeric value analysis, the operating state of the SoC die 201 (CPU 101) and the state of memory access to the wide IO SDRAM 113 according to the operation of the SoC die 201 may be analyzed, in the case where individual processes such as print processing and scan processing are performed by the MFP 100. Furthermore, the change with time in the temperature distribution of the memory chips (SDRAMs 301 to 304), which changes according to the operating state of the SoC die 201 and the state of memory access to the wide IO SDRAM 113, may be analyzed. Note that the temperature distribution in the memory chips is information indicating the temperature distribution of the surface of the memory chips, for example.

FIG. 7A shows an example of the predetermined temperature information of the SDRAM 301 in the case where the MFP 100 executes print processing. On the other hand, FIG. 7B shows an example of the predetermined temperature information of the SDRAM 301 in the case where the MFP 100 executes scan processing. In the present embodiment, only the predetermined temperature information corresponding to print processing and scan processing are shown in FIGS. 7A and 7B. However, for other processes executed by the MFP 100, other predetermined temperature information may be furthermore generated in advance and made available. For example, it is possible to generate in advance predetermined temperature information corresponding to the operating states of the SoC die 201 and the wide IO SDRAM 113 in the case where the MFP 100 executes processes such as image editing, fax transmission/reception, e-mail transmission, and various types of application processes. Alternatively, it is possible to generate in advance the predetermined temperature information that corresponds to the operating states of the SoC die 201 and the wide IO SDRAM 113 according to the operation ratio of the CPU 101 in a specific operating state of the MFP 100 (e.g., a standby state (idle state) or a sleep state).

The X and Y coordinates shown in FIGS. 7A and 7B correspond to the X and Y coordinates shown in FIG. 6 respectively. Also, temperatures C0 to C4 indicate temperatures at various times in the areas (X,Y) ((0,0) to (7,7)) in the case where print processing or scan processing has continued for a fixed period of time in the MFP 100. That is to say, the temperatures C0 to C4 show the change with time in the temperatures of the areas of the SDRAM 301.

Figures 8, 9:
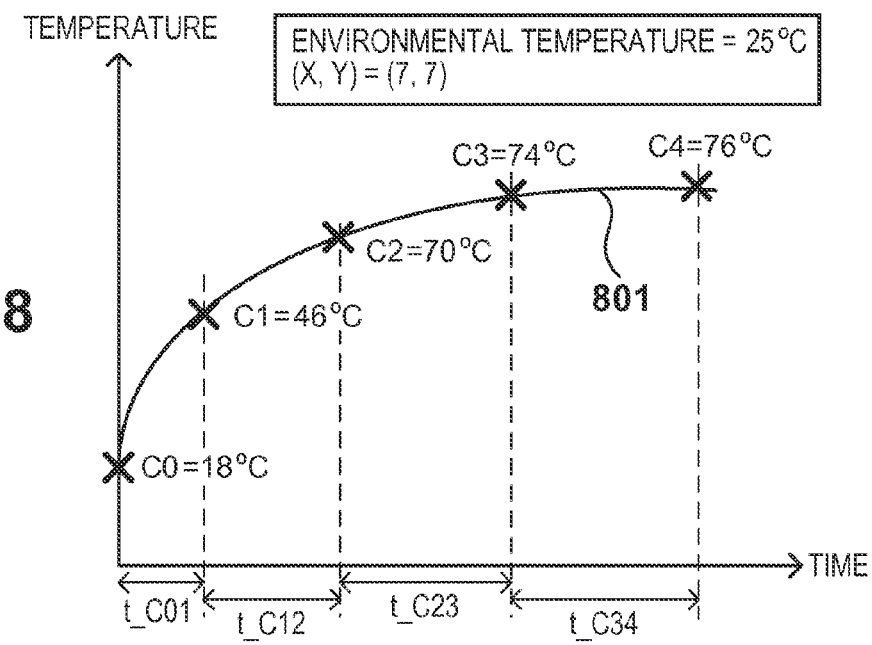
FIG. 8 is a diagram showing an example of results from a heat simulation regarding temperature distribution in the memory chip (SDRAM 301) in the case where print processing is executed by an MFP according to the first embodiment of the present invention.
FIG. 9 is a diagram showing an example of the content of updated temperature information used in the first embodiment of the present invention.

Here, FIG. 8 is a diagram showing an example of the results of the heat simulation regarding the temperature distribution in the SDRAM 301 in the case where print processing is executed by the MFP 100. Graph 801 shown in FIG. 8 shows change in temperature (temperature characteristics) regarding a specific area (7,7) of the SDRAM 301. Note that the X axis denotes time, the Y axis denotes temperature, and the temperatures C0 to C4 correspond to the temperatures C0 to C4 in the area (7,7) shown in FIG. 7A.

In FIG. 8, the temperature C0 indicates the temperature in the case where the SoC die 201 is in a non-operating state and the temperature in the memory chip (SDRAM 301) is uniform regardless of location. The temperature C1 indicates the temperature of the area (7,7) at the point in time when the SoC die 201 has started an operation for print processing in a state where the area (7,7) in the memory chip is at the temperature C0, and the operation has continued for the time period t_C01. Similarly, the temperatures C2, C3, and C4 each indicate the temperature of the area (7,7) at the point in time when the operation for print processing has continued for the time periods t_C12, t_C23, and t_C34, with the temperatures C1, C2, and C3 as the starting points. As shown in FIG. 8, the predetermined temperature information used in the present embodiment includes information obtained by sampling, at multiple different times, the temperatures of the areas obtained by dividing the memory chip into multiple areas. That is to say, the predetermined temperature information includes information indicating the temperature of areas at multiple different points in time after the SoC die 201 has started the specific operation, as information stored in a table format.

Note that in FIG. 8, the time periods t_C01, t_C12, t_C23, and t_C34 are each set to different lengths. That is to say, the temperatures sampled at non-uniform time intervals are used as the temperatures of the areas included in the predetermined temperature information indicated by FIGS. 7A and 7B. However, the time intervals for sampling may be non-uniform time intervals, or they may be uniform time intervals. Also, the number of area temperature samples included in the predetermined temperature information may be five as shown in FIG. 8, or it may be a number of samples that is less than or greater than five. In this way, even in the case where the present embodiment is modified, processing similar to the later-described processing of the present embodiment can be realized and similar advantages can be obtained.

<Content of Updated Temperature Information (Temperature Distribution Information)>

Next, a description will be given for a specific example of the temperature distribution information (updated temperature information) that is generated based on the temperature information (sensor information) acquired from the temperature sensors 309 to 312 and the predetermined temperature information generated by the analysis that was performed in advance, as described above.

FIG. 9 is a diagram showing an example of the content of the updated temperature information used in the present embodiment. In the present embodiment, the CPU 101 estimates the current temperature distribution of each of the SDRAMs 301 to 304 according to the operating states of the SoC die 201 and the wide IO SDRAM 113 and holds the estimated temperature distribution as information stored in a table format. The updated temperature information can be updated in real time (e.g., at a pre-set update interval) based on the predetermined temperature information.

The updated temperature information used in the present embodiment is obtained by storing the temperature information indicating temperatures that have been updated (updated temperatures) at predetermined locations on the SDRAM 301 (corresponding to the divided areas shown in FIG. 6) in a table format, as shown in FIG. 9. Note that the X coordinates and the Y coordinates shown in FIG. 9 correspond to the X coordinates and Y coordinates shown in FIG. 6, similarly to FIGS. 7A and 7B.

The updated temperature information shown in FIG. 9 can be generated based on the predetermined temperature information shown in FIGS. 7A and 7B. For example, the updated temperature information is generated based on the predetermined temperature information that corresponds to the operating states of the SoC die 201 and the wide IO SDRAM 113, using the temperature of the SDRAM 301 at the location of the temperature sensor 309 indicated by the temperature information from the temperature sensor 309 as a reference. Note that a specific example of this kind of updated temperature information generation processing will be described later with reference to FIG. 10.

In FIG. 9, temperature information 901 indicates the temperature at a location (area) at which the temperature sensor 309 is provided in the memory chip (SDRAM 301). In the present embodiment, (X,Y)=(4,5) is used as an example of a location at which the temperature sensor 309 is provided. However, the location of the temperature sensor 309 is not limited to only that location, and it is possible to provide the temperature sensor 309 at an arbitrary location in the memory chip. Additionally, the temperature information 902 indicates the temperature of a location at which the temperature is the highest (a hotspot) in the memory chip, which is included in the current temperature distribution in the memory chip indicated by the updated temperature information. In other words, the updated temperature information shown in FIG. 9 indicates that a hotspot exists in the area (7,7) of the memory chip. In the present embodiment, as will be described below, the CPU 101 sets the thermal offset value according to the difference between the temperature at the location of the temperature sensor (temperature information 901) and the temperature at the hotspot (temperature information 902), which are included in the temperature distribution indicated by the updated temperature information.

<Generation and Updating of Updated Temperature Information (Temperature Distribution Information)>

A procedure of processing for generating and updating the updated temperature information in the present embodiment will be described next with reference to the flowchart in FIG. 10. Note that a program for executing this processing is installed in advance in the HDD 105. This processing is realized in the MFP 100 by the CPU 101 loading the program from the HDD 105 to the SDRAM 301 and executing the loaded program. Although the processing will be described below with respect to the SDRAM 301, the CPU 101 executes similar processing with respect to the SDRAMs 302 to 304 as well.

First, after the MFP 100 is activated from a powered-off state, in step S1001, the CPU 101 determines whether or not the updated temperature information has already been generated. Here, the CPU 101 determines whether or not an update flag (Updflag) has been set to "true". In the present embodiment, the CPU 101 sets the update flag to "true" when the updated temperature information has been generated for the first time. Also, the CPU 101 sets the update flag to "false" according to the power source of the MFP 100 entering an off state or having been reset. According to this, each time the MFP 100 is activated from the powered-off state, the updated temperature information is initialized and newly generated by the CPU 101. Note that the update flag may be stored in the HDD 105, or may be stored in the wide IO SDRAM 113 (e.g., SDRAM 301).

In step S1001, if the CPU 101 determines that the update flag is "false" (i.e., the updated temperature information has not been generated), the procedure moves to the processing of step S1004. On the other hand, if the CPU 101 determines that the update flag is "true" (i.e., the updated temperature information has already been generated), the procedure moves to the processing of step S1002.

In step S1002, the CPU 101 increments a time counter (Cnt). Note that the time counter can be realized by a timer function of the CPU 101. At the start time of the processing shown in FIG. 10, the time counter is in a state of being initialized at zero (Cnt=0). Next, in step S1003, the CPU 101 determines whether or not a predetermined time period has elapsed since the most recent update of the updated temperature information by determining whether or not the time counter has reached a predetermined counter value (Th_cnt).

Here, the predetermined counter value (Th_cnt) is set based on the pre-set update interval of the updated temperature information. In the present embodiment, the predetermined counter value (Th_cnt) is set to a fixed value, and the update interval of the updated temperature information is set to a fixed time interval. However, the update interval of the updated temperature information may be changed according to, for example, the operating states of the SoC die 201 and the wide IO SDRAM 113 and the like.

In step S1003, as long as the CPU 101 determines that the time counter is at or below the predetermined counter value (Cnt≤Th_cnt), the procedure returns to the processing of step S1002. On the other hand, if the CPU 101 determines that the time counter is greater than the predetermined counter value (Cnt>Th_cnt), the procedure moves to the processing of step S1004.

In step S1004, the CPU 101 reads out the predetermined temperature information that was stored in advance in the HDD 105 or the ROM 106 and the procedure moves to the processing of step S1005. Here, the predetermined temperature information that corresponds to a process being executed by the MFP 100 at the readout time is read out by the CPU 101 from the HDD 105 or the ROM 106. Accordingly, the CPU 101 uses the predetermined temperature information corresponding to the operating states of the SoC die 201 and the wide IO SDRAM 113 for the generation of the updated temperature information (temperature distribution information). Note that the case of reading out the predetermined temperature information corresponding to print processing shown in FIG. 7A will be described below as an example.

Next, in steps S1005 to S1010, the CPU 101 generates or updates the updated temperature information. Specifically, the CPU 101 compares the temperature indicated by the temperature information from the temperature sensor 309 and the temperature change (temperature characteristics) of the memory chip (SDRAM 301) at the location of the temperature sensor 309, which is indicated by the read-out predetermined temperature information corresponding to processing that is being executed by the MFP 100. By doing so, the CPU 101 specifies the elapsed time since the SoC die 201 started the specific operation (i.e., the operation for print processing). Furthermore, the CPU 101 generates information indicating the temperature distribution in the memory chip corresponding to the specified elapsed time, as the updated temperature information indicating the current temperature distribution in the memory chip.

Specifically, in step S1005, the CPU 101 first creates an approximate curve that indicates the temperature change (temperature characteristics) of the areas of the SDRAM 301 based on the predetermined temperature information read out in step S1004. FIG. 11 is a diagram showing an example of the approximate curve created based on the predetermined temperature information regarding the area (4,5) at which the temperature sensor 309 is located, which is shown in FIG. 7A. In FIG. 11, the X axis indicates time, the Y axis indicates temperature, and five points 1101 to 1105 respectively correspond to the temperatures C0 to C4 in FIG. 7A. The CPU 101 calculates an approximate curve 1110 with a predetermined approximation method, based on these points. Note that the approximation method need only be a method suitable for reproducing the temperature characteristics based on discrete values obtained by the above-mentioned heat simulation, and, for example, it can be realized by linear approximation or logarithmic approximation. Note that the case of using logarithmic approximation is shown as an example in FIG. 11.

After generating the approximate curve 1102 in step S1005, in step S1006, the CPU 101 again determines whether or not the updated temperature information has already been generated after the activation of the MFP 100 from the powered-off state, similarly to step S1001. In step S1006, if the CPU 101 determines that the update flag is "false" (i.e., the updated temperature information has not been generated), the procedure moves to the processing of step S1007. On the other hand, if the CPU 101 determines that the update flag is "true" (i.e., the updated temperature information has already been generated), the procedure moves to the processing of step S1008.

In steps S1007 and S1008, the CPU 101 derives the initial temperature to be used in the generation of the updated temperature information. In step S1007, by acquiring the temperature information from the temperature sensor 309 in accordance with the procedure shown in FIG. 12, the temperature of the SDRAM 301 at the location of the temperature sensor 309, which is indicated by the acquired temperature information, is derived by the CPU 101 as the initial temperature. On the other hand, in step S1008, the temperature of the SDRAM 301 at the location of the temperature sensor 309, which is indicated by the temperature information included in the updated temperature information that was generated or most recently updated and has been generated in advance, is derived by the CPU 101 as the initial temperature.

<Processing for Acquiring Temperature Information>

Figure 12:
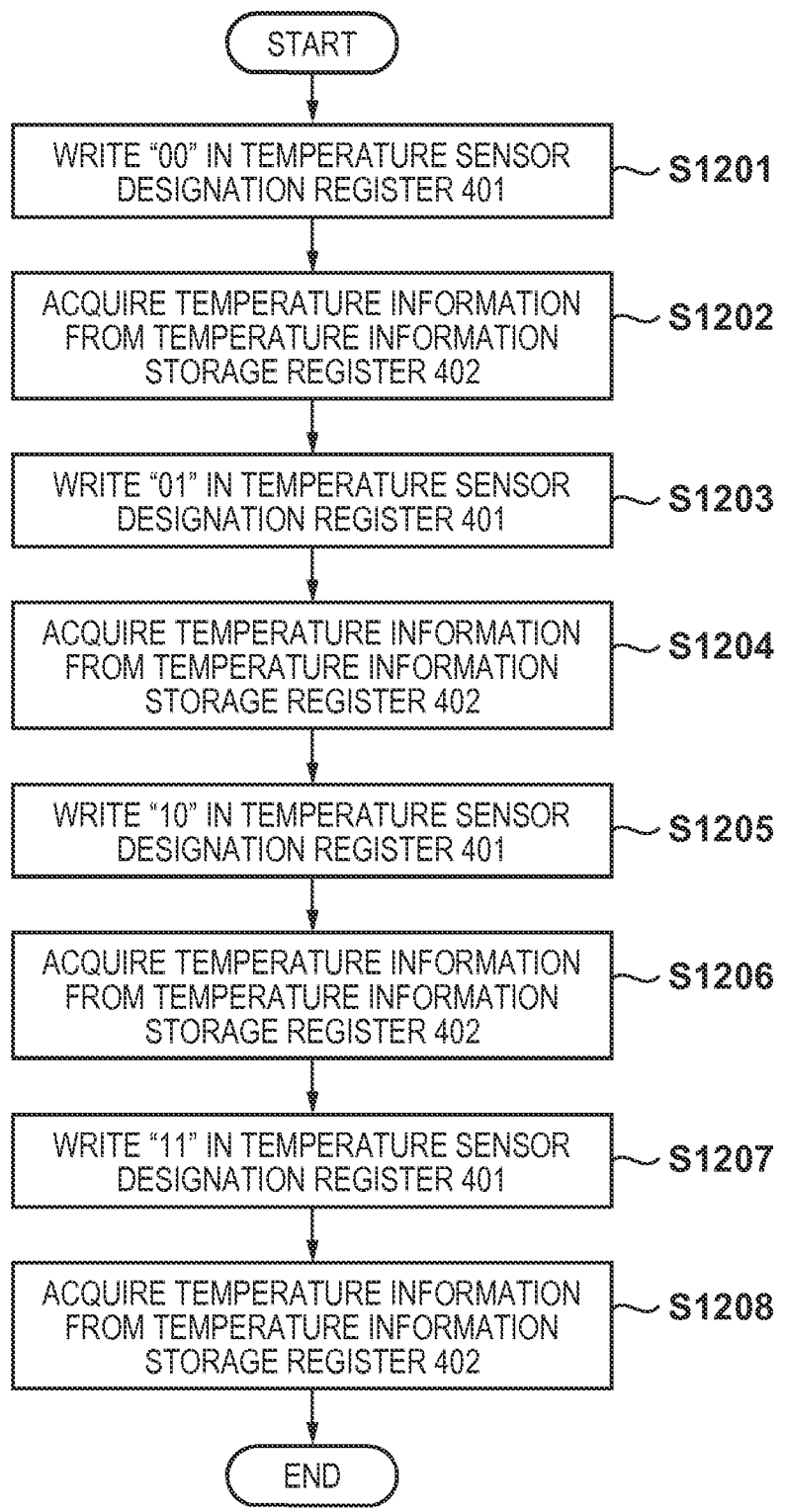
FIG. 12 is a flowchart showing a procedure of processing for the CPU to acquire temperature information indicating temperatures measured by temperature sensors in the MFP according to the first embodiment of the present invention.

Here, a procedure of processing for the CPU 101 to acquire temperature information indicating the temperatures of the SDRAMs 301 to 304 measured with the temperature sensors 309 to 312 in the MFP 100 according to the present embodiment will be described with reference to FIG. 12. In the present embodiment, the MFP 100 is provided with four temperature sensors 309 to 312, and therefore the flowchart in FIG. 12 shows processing for acquiring temperature information from the four temperature sensors. Note that a program for executing this processing is installed in advance in the HDD 105. This processing is realized in the MFP 100 by the CPU 101 loading the program from the HDD 105 to the SDRAM 301 and executing the loaded program.

First, in step S1201, the CPU 101 writes "00" in the temperature sensor designation register 401. In the present embodiment, four temperature sensors are provided in the SoC package 207. It is thus assumed that, in order to designate the temperature sensors, the CPU 101 associates the temperature sensors with a setting value of the temperature sensor designation register 401 in the following manner. That is to say, the values "00", "01", "10", and "11" of the temperature sensor designation register 401 are assumed to be associated with the temperature sensors 309 to 312 respectively. Accordingly, in step S1201, the CPU 101 writes "00" in the temperature sensor designation register 401 in order to designate the temperature sensor 309.

Next, moving to step S1202, the CPU 101 issues a temperature information readout request to the temperature information storage register 402 and acquires temperature information indicating the temperature of the SDRAM 301, which was measured by the temperature sensor 309. Here, as described above, upon detecting the readout request from the CPU 101, the temperature information storage register 402 acquires temperature information from the temperature sensor designated by the temperature sensor designation register 401. Moreover, the temperature information storage register 402 outputs the acquired temperature information to the CPU 101 as response data in response to the readout request from the CPU 101. Thus, the CPU 101 acquires the temperature information from the temperature sensor 309 in step S1202.

Next, moving to step S1203, the CPU 101 writes "01" in the temperature sensor designation register 401 in order to acquire temperature information indicating the temperature of the SDRAM 302, which was measured by the temperature sensor 310. Subsequently, moving to step S1204, the CPU 101 issues a temperature information readout request to the temperature information storage register 402 and acquires the temperature information from the temperature sensor 310.

Next, moving to step S1205, the CPU 101 writes "10" in the temperature sensor designation register 401 in order to acquire temperature information indicating the temperature of the SDRAM 303, which was measured by the temperature sensor 311. Subsequently, moving to step S1206, the CPU 101 issues a temperature information readout request to the temperature information storage register 402 and acquires the temperature information from the temperature sensor 311.

Next, moving to step S1207, the CPU 101 writes "11" in the temperature sensor designation register 401 in order to acquire temperature information indicating the temperature of the SDRAM 304, which was measured by the temperature sensor 312. Subsequently, moving to step S1208, the CPU 101 issues a temperature information readout request to the temperature information storage register 402 and acquires the temperature information from the temperature sensor 312.

According to the above-described processing, the CPU 101 can acquire temperature information indicating the temperatures of the SDRAMs 301 to 304, which were measured by the temperature sensors 309 to 312, from the temperature sensors 309 to 312.

<Continuation of Updated Temperature Information Generation Processing>

Returning once again to the description of FIG. 10, in step S1009, the CPU 101 subsequently derives the offset time to be used for the generation of updated temperature information based on the initial temperature obtained in step S1007 or S1008 and the approximate curve 1110 created in step S1005.

If the updated temperature information has not yet been generated, in step S1009, the CPU 101 executes the following processing based on the approximate curve corresponding to the location of the temperature sensor 309. The elapsed time from when the SoC die 201 started the specific operation until when the temperature at the location of the temperature sensor 309 changed to the initial temperature (the temperature indicated by the temperature information of the temperature sensor 309) acquired in step S1007 is specified by the CPU 101 as an offset time T_ofs. Here, the offset time T_ofs can be derived by using the approximate curve 1110 for the area (4,5) at which the temperature sensor 309 is located, which is shown in FIG. 11. For example, if the initial temperature is 36° C., the offset time T_ofs can be derived as the time at which the temperature reaches 36° C. on the approximate curve 1110.

On the other hand, if the updated temperature information has already been generated, the CPU 101 executes the following processing in step S1009 based on the approximate curve corresponding to the location of the temperature sensor 309. The elapsed time from when the SoC die 201 started the specific operation until when the temperature at the location of the temperature sensor 309 changed to the initial temperature that was acquired in step S1008 is specified by the CPU 101 as the offset time T_ofs. In other words, the CPU 101 derives the offset time T_ofs based on the temperature at the location of the temperature sensor 309, which is included in the updated temperature information that was updated most recently (or generated). For example, if the initial temperature obtained from the updated temperature information that was generated most recently is 36° C., the offset time T_ofs can be derived as the time at which the temperature reaches 36° C. on the approximate curve 1110 as shown in FIG. 11.

Next, in step S1010, the CPU 101 generates or updates the updated temperature information based on the offset time T_ofs specified in step S1009. Specifically, the temperatures of the areas in the memory chip (SDRAM 301) that correspond to the time T_n. T_n is a time after the elapse of a period corresponding to the counter value Cnt from the offset time T_ofs. The specified temperatures are used to generate or update the updated temperature information.

If the updated temperature information has not yet been generated, the counter value Cnt=0. In this case, the CPU 101 specifies the temperature corresponding to the offset time T_ofs (=T_n) based on the approximate curves calculated for the areas in the memory chip (SDRAM 301). Due to this, information indicating the temperature distribution in the memory chip (SDRAM 301) at the point in time at which the offset time T_ofs has elapsed since the SoC die 201 started the specific operation is generated by the CPU 101 as the updated temperature information. Additionally, the CPU 101 sets the update flag to "true", which indicates that the updated temperature information has been generated. In this way, the information indicating the temperature distributions in the memory chips, corresponding to the elapsed time since the SoC die 201 started the specific operation, is generated by the CPU 101 as the updated temperature information, based on multiple approximate curves regarding temperature, which correspond to multiple areas in the memory chip.

On the other hand, if the updated temperature information has already been generated, the temperature corresponding to the time T_n (>T_ofs) is specified by the CPU 101 based on the approximate curves that were calculated for the areas. T_n is a time after the elapse of the period corresponding to the counter value Cnt from the offset time T_ofs. For example, the temperature (updated temperature) in the area in which the temperature sensor 309 is located is specified as 48° C. based on the approximate curve 1110, as shown in FIG. 11. Accordingly, the CPU 101 updates the updated temperature information with information indicating the temperature distribution in the memory chip (SDRAM 301) at the point in time at which the time T_n has elapsed since the SoC die 201 started the specific operation.

In step S1010, the updated temperature information that was generated or updated is stored in the HDD 105 or the wide IO SDRAM 113 as information stored in a table format as shown in FIG. 9. Finally, in step S1011, the CPU 101 resets the counter value Cnt of the time counter (sets Cnt=0) and ends the processing.

<Setting of Thermal Offset Value>

A procedure of processing for setting the thermal offset value in the present embodiment will be described next with reference to the flowchart in FIG. 13. Note that a program for executing this processing is installed in the HDD 105 in advance. This processing is realized in the MFP 100 by the CPU 101 loading the program from the HDD 105 to the SDRAM 301 and executing the loaded program.

The processing shown in FIG. 13 is first executed in a series of activation sequences executed at the time of activating the MFP 100 from the powered-off state, and subsequently continues to be executed periodically. First, in step S1301, the CPU 101 executes processing for generating (updating) the updated temperature information in accordance with the procedure shown in FIG. 10 for each of the SDRAMs 301 to 304.

Next, in step S1302, based on the updated temperature information that was generated or updated in step S1301, the CPU 101 compares the temperatures at the locations of the temperature sensors 309 to 312 and the temperature at a hotspot and derives the difference (temperature difference) between them. For example, if the updated temperature information is the information shown in FIG. 9, the temperature at the area (4,5) in which the temperature sensor 309 is located is 48° C. (temperature information 901) and the temperature at the area (7,7) that corresponds to the hotspot is 60° C. (temperature information 902). In this case, 12° C. is derived as the temperature difference.

Next, in step S1303, the CPU 101 sets the thermal offset value to be used for the refresh operation for each of the SDRAMs 301 to 304 in accordance with the temperature difference derived in step S1302. For example, the CPU 101 sets the thermal offset value to a higher value as the difference between the temperatures at the locations of the temperature sensors 309 to 312 and the temperature at the hotspot increases.

Here, FIG. 14 is a diagram showing an example of the relationship between the temperature difference and the thermal offset values to be set, which will be used in the present embodiment. The relationship shown in FIG. 14 is already standardized as "JESD229 Wide I/O Single Data Rate". As shown in FIG. 14, if a temperature difference 1400 (thermal gradient) is less than 5° C., a thermal offset value 1401 (thermal offset) is determined to be 0. On the other hand, if the temperature difference 1400 is 5° C. to 15° C., the thermal offset value 1401 is determined to be 1.

The CPU 101 sets the thermal offset values for the SDRAMs 301 to 304 by writing the determined thermal offset values in the thermal offset registers 411 to 414.

<Setting of Self-Refresh Mode>

A procedure of processing for setting the self-refresh mode will be described next with reference to FIG. 15. Note that a program for executing this processing is installed in advance in the HDD 105. This processing is realized in the MFP 100 by the CPU 101 loading the program from the HDD 105 to the SDRAM 301 and executing the loaded program. The processing shown in FIG. 15 is executed by the CPU 101 when the SDRAMs 301 to 304 in the wide IO SDRAM 113 are to be set to the self-refresh mode. A description will be given below with respect to the SDRAM 301, but the CPU 101 executes similar processing with respect to the SDRAMs 302 to 304 as well.

First, in step S1501, the CPU 101 performs a check with respect to the memory controller operation mode setting register 403 in the register 314 using the memory controller 305. Specifically, the CPU 101 determines whether or not the operation mode of the memory controller 305 has been set to the self-refresh mode, based on a setting value stored in the memory controller operation mode setting register 403. Here, if the memory controller 305 has not been set to the self-refresh mode, the CPU 101 repeats the determination processing of step S1501. On the other hand, if the memory controller 305 has been set to the self-refresh mode, the CPU 101 advances the procedure to step S1502.

In step S1502, the CPU 101 determines whether or not the memory controller 305 is in the standby state (idle state). If some type of data processing is being performed and the memory controller 305 is not in the standby state, the CPU 101 repeats the determination processing of step S1502. On the other hand, if the memory controller 305 is in the standby state, the procedure moves to the processing of step S1503.

In step S1503, the CPU 101 causes a thermal offset setting command including the thermal offset value to be issued from the memory controller 305 to the SDRAM 301. The setting value stored in the thermal offset register 411 is included in the thermal offset setting command.

Next, in step S1504, the CPU 101 causes a command for reading out the setting value for the thermal offset value stored in the SDRAM 301 to be issued from the memory controller 305 to the SDRAM 301. As a result, the memory controller 305 writes the read-out value in the thermal offset status register 407 in the register 314. Accordingly, it is possible to check whether or not the thermal offset value that the CPU 101 attempted to set in the SDRAM 301 in step S1503 is correct.

Upon confirming that the thermal offset value that was set is correct, the CPU 101 causes a self-refresh setting command to be issued from the memory controller 305 to the SDRAM 301 in step S1505. Accordingly, the CPU 101 causes the SDRAM 301 to shift to the self-refresh mode (transition to the self-refresh state). That is to say, the CPU 101 causes the SDRAM 301 to execute a refresh operation at a refresh cycle corresponding to the thermal offset value that has been set.

Note that the protocol related to the commands issued in steps S1503, S1504, and S1505 is already standardized as "JESD229 Wide I/O Single Data Rate".

As described above, the MFP 100 of the present embodiment generates the temperature distribution information (updated temperature information) indicating the current temperature distribution in the memory chip, based on the predetermined temperature information generated by the analysis that was executed in advance and the temperature information obtained by the temperature sensors 309 to 312. The predetermined temperature information includes information related to the temperature distribution in the memory chip, which corresponds to the operating states of the SoC die 201 and the wide IO SDRAM 113. Furthermore, the MFP 100 sets the thermal offset value to be used for the refresh operation of the memory chip according to the differences between the temperatures at the locations of the temperature sensors 309 to 312 and the temperature of a hotspot in the memory chip, which are included in the temperature distribution indicated by the updated temperature information.

According to the present embodiment, it is possible to accurately estimate change in the temperature distribution in the memory chip according to the operating states of the SoC die 201 and the wide IO SDRAM 113. Furthermore, it is possible to more appropriately set the thermal offset value according to the estimated temperature distribution. By appropriately setting the thermal offset value in this way, it is possible to prevent increases in power consumption and the loss of stored content in the memory chip caused by temperature differences between hotspots and the locations of the temperature sensors.

Additionally, in the MFP 100 according to the present embodiment, the updated temperature information may be updated at an appropriate update interval according to the operating states of the SoC die 201 and the wide IO SDRAM 113, and the setting of the thermal offset value may be executed periodically based on the updated temperature information that has been updated. Accordingly, it is possible to appropriately control the thermal offset value to be used such that it matches the change in the operating states of the SoC die 201 and the wide IO SDRAM 113.

Second Embodiment

The first embodiment described a case in which the updated temperature information is updated at a pre-set update interval to match changes in the operating states of the SoC die 201 and the wide IO SDRAM 113. In such a case, there is a possibility of a deviation occurring between the temperature distribution indicated by the updated temperature information and the actual temperature distribution in the memory chips (SDRAMs 301 to 304) when the updated temperature information is updated. An example of enabling the thermal offset value to be set appropriately even in the case where this type of deviation occurs will be described in the second embodiment. Note that for the sake of simplification, descriptions of portions in common with the first embodiment will be omitted, and the following description will focus on portions different from the first embodiment.

<Generation and Updating of Updated Temperature Information (Temperature Distribution Information)>

A procedure of processing for generating and updating the updated temperature information in the present embodiment will be described below with reference to FIGS. 16A and 16B. Note that a program for executing this processing is installed in advance in the HDD 105. This processing is realized on the MFP 100 by the CPU 101 loading the program from the HDD 105 to the SDRAM 301 and executing the loaded program. A description will be given below with respect to the SDRAM 301, but the CPU 101 executes similar processing with respect to the SDRAMs 302 to 304 as well.

Figure 10:
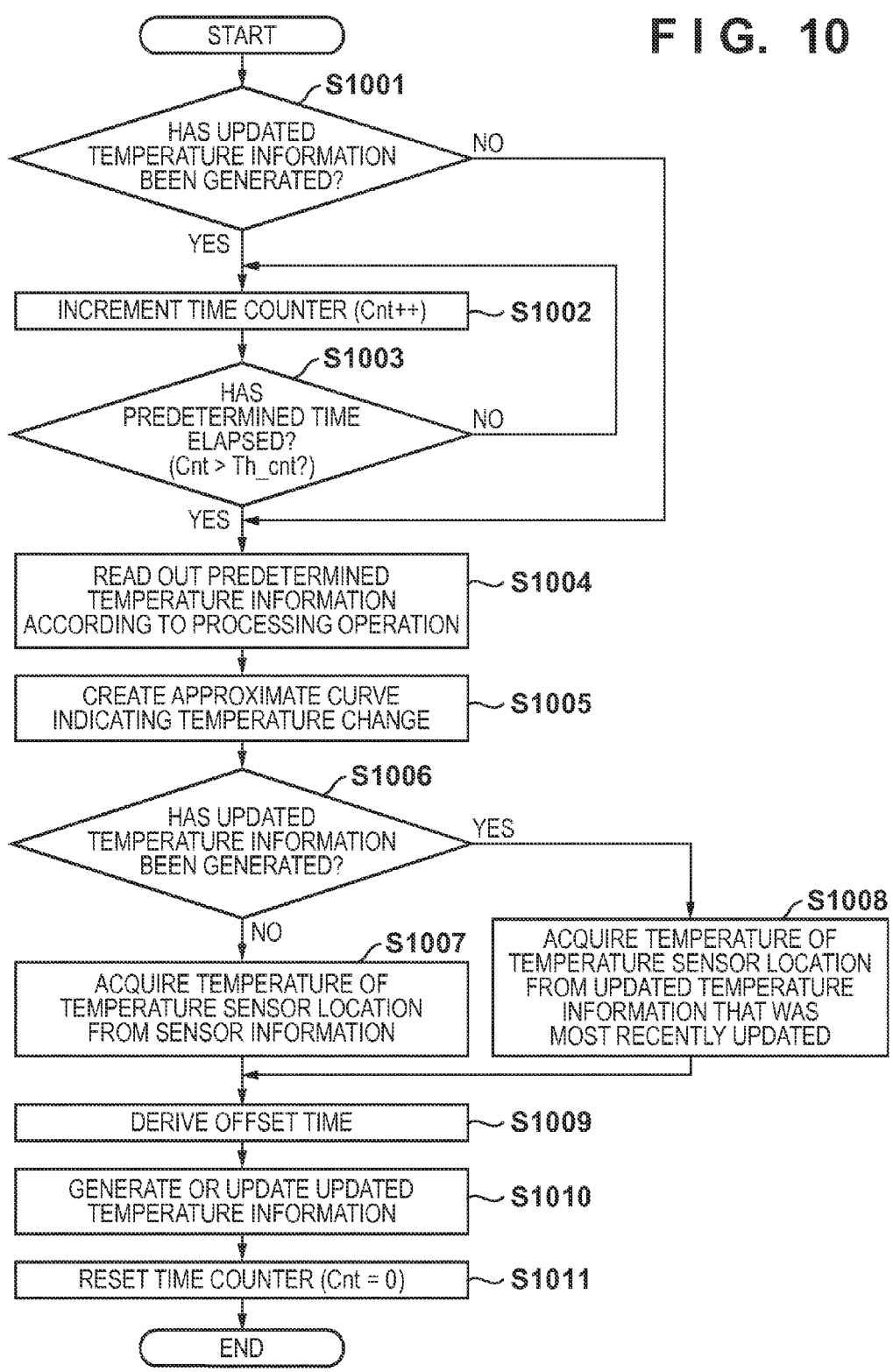
FIG. 10 is a flowchart showing a procedure of processing for a CPU to generate and update the updated temperature information in the MFP according to the first embodiment of the present invention.
Figure 16B:
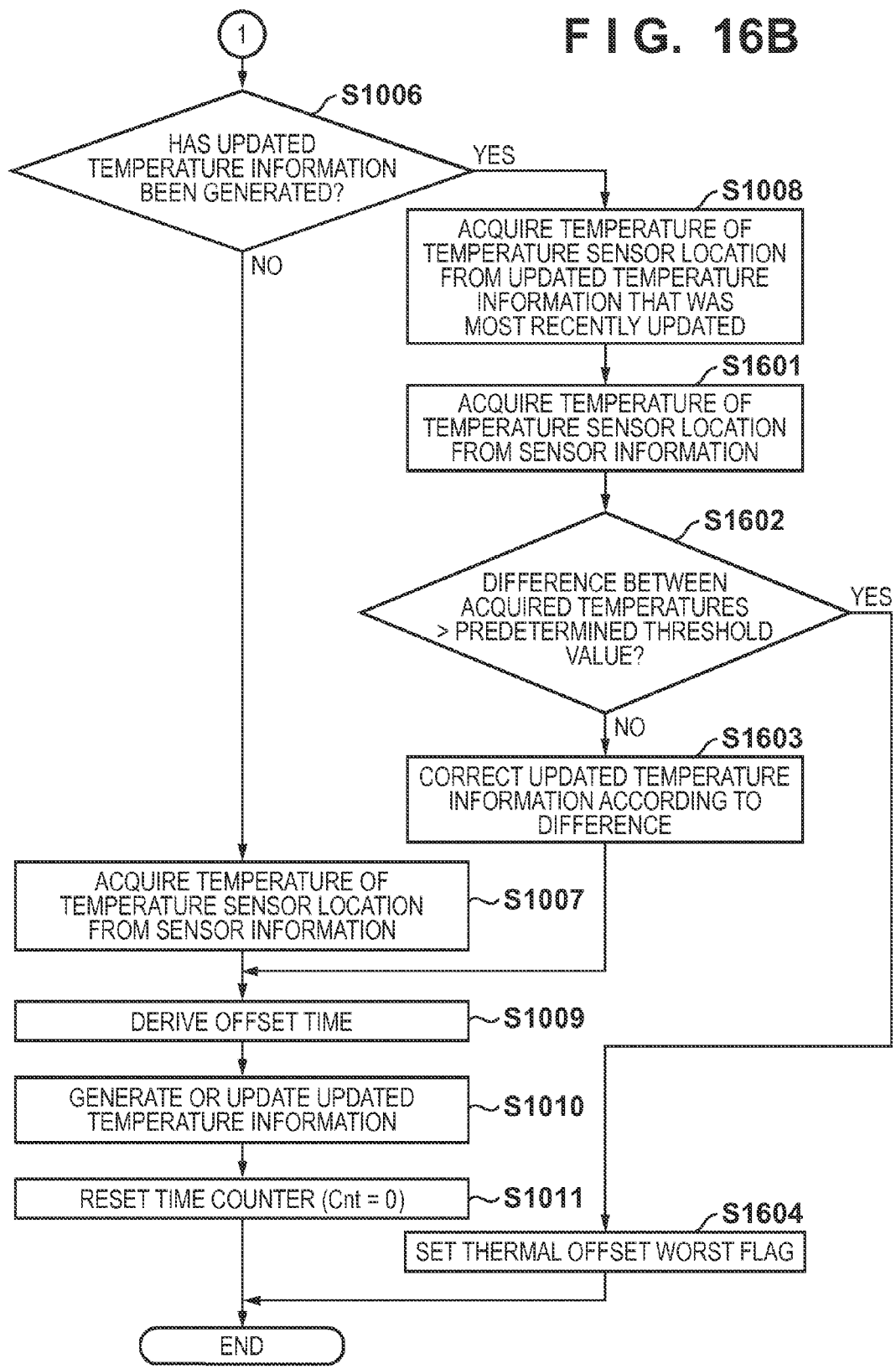

In FIGS. 16A and 16B, the same reference numerals as in the first embodiment denote steps (steps S1001 to S1011) for executing processes that are the same as those in the first embodiment (FIG. 10). In the present embodiment, if the updated temperature information has already been generated, the CPU 101 derives the initial temperature in step S1008 and subsequently advances the procedure to step S1601.

In step S1601, the temperature information indicating the temperature of the SDRAM 301 at the location of the temperature sensor 309 is acquired by the CPU 101 from the temperature sensor 309 using processing similar to that of step S1007 (FIG. 12). Furthermore, in step S1602, the CPU 101 calculates the difference between the temperature indicated by the temperature information acquired in step S1601 and the temperature (initial temperature) at the location of the temperature sensor 309, which is indicated by the temperature information included in the updated temperature information acquired in step S1008, and determines whether or not the difference exceeds a predetermined threshold value. The predetermined threshold value is a threshold value that is set in advance in order to evaluate the amount of deviation between the temperature at the location of the temperature sensor 309, which is included in the updated temperature information, and the actual temperature. In the present embodiment, if the deviation is relatively large, the thermal offset value is set to the largest value among possible values, rather than being set based on the updated temperature information.

In step S1602, if the CPU 101 determines that the calculated difference is at or below the predetermined threshold, the procedure moves to the processing of step S1603, and if the CPU 101 determines that the calculated difference exceeds the predetermined threshold value, the procedure moves to the processing of step S1604. In step S1604, the CPU 101 sets the thermal offset worst flag (Worstflag) to "true". When "true", this flag indicates the fact that the thermal offset value is to be mandatorily set to the largest value among possible values, regardless of the content of the updated temperature information.

On the other hand, in step S1603, the CPU 101 corrects the updated temperature information that was generated or updated most recently in accordance with the difference that was calculated in step S1602. Specifically, the CPU 101 adds the difference calculated in step S1602 to the temperatures (updated temperatures) of the areas of the SDRAM 301, which are included in the updated temperature information that was generated or updated most recently.

FIG. 18 is a diagram showing an example of the content of the updated temperature information before and after the correction in step S1603. A value 1800 of the temperature sensor 309 is a temperature indicating the temperature information acquired from the temperature sensor 309, and the temperature of the area (4,5) at which the temperature sensor 309 is located is 52° C. A pre-correction updated temperature 1801 is an updated temperature of the areas (X,Y) that is included in the updated temperature information referenced in step S1008, and the updated temperature of the area (4,5) at which the temperature sensor 309 is located is 48° C. Thus, the temperature at the location of the temperature sensor 309, which is included in the updated temperature information, deviates from the actual temperature by +4° C. Because of this, in step S1603, the CPU 101 corrects the updated temperature information as shown by the post-correction updated temperature 1802 in FIG. 18 by adding +4° C. to the updated temperature of all areas included in the updated temperature information.

In the present embodiment, if the updated temperature information that has already been generated is to be updated in steps S1009 and S1010, the CPU 101 executes processing using the post-correction updated temperature information according to step S1603.

<Setting of Thermal Offset Value>

Figure 17:
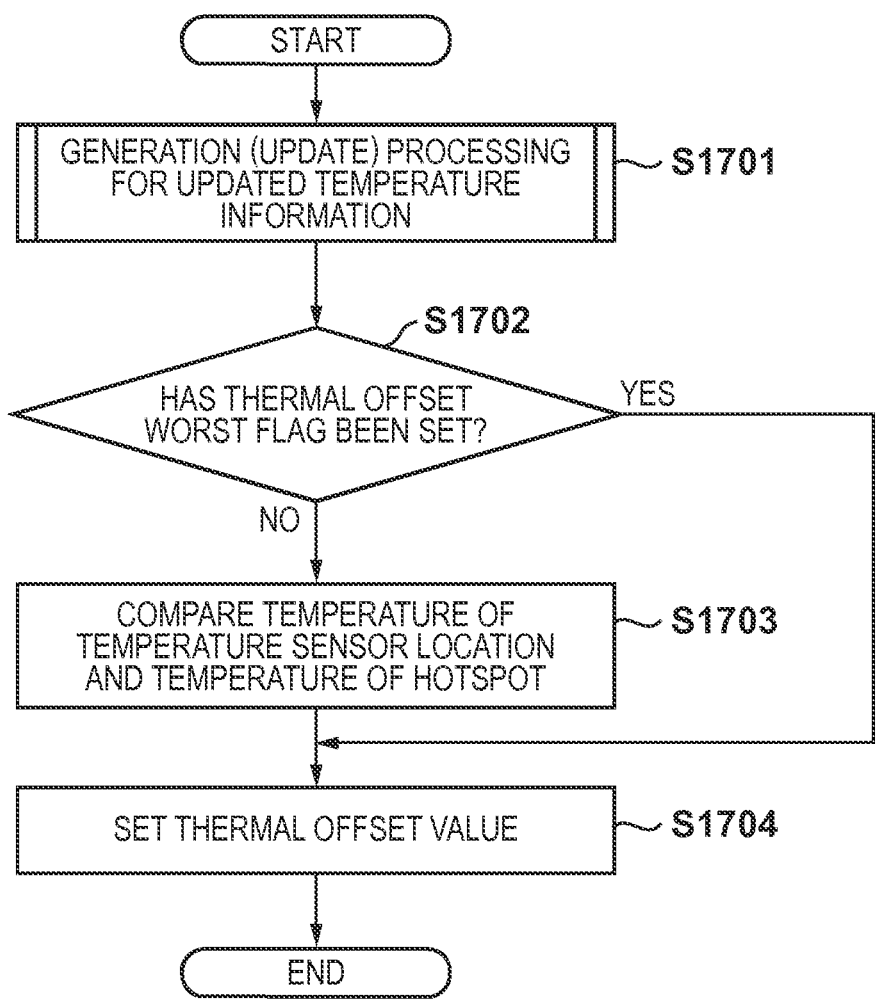
FIG. 17 is a flowchart showing a procedure of processing for the CPU to set the thermal offset value in the MFP according to the second embodiment of the present invention.

A procedure of processing for setting the thermal offset value of the present embodiment will be described next with reference to the flowchart in FIG. 17. Note that a program for executing this processing is installed in advance in the HDD 105. This processing is realized in the MFP 100 by the CPU 101 loading the program from the HDD 105 to the SDRAM 301 and executing the loaded program.

The processing shown in FIG. 17, similarly to the first embodiment (FIG. 13), is first executed in a series of activation sequences that are executed at the time of activating the MFP 100 from a powered-off state, and subsequently continues to be executed periodically. Also, the processing shown in FIG. 17 is executed for each of the SDRAMs 301 to 304. Here, a description of processing with respect to the SDRAM 301 will be given, and the same follows for the processing with respect to the SDRAMs 302 to 304.

First, in step S1701, the CPU 101 executes processing for generating (updating) the updated temperature information in accordance with the procedure shown in FIGS. 16A and 16B for the SDRAM 301.

Next, in step S1702, the CPU 101 determines whether or not the thermal offset worst flag (Worstflag) has been set (i.e., whether or not it has been set to "true"). If the CPU 101 determines that the flag has not been set (the flag has been set to "false"), the procedure moves to the processing of step S1703, and if the CPU 101 determines that the flag has been set (set to "true"), the procedure moves to the processing of step S1704.

In step S1703, based on the updated temperature information that was generated or updated in step S1701, the CPU 101 compares the temperatures at the locations of the temperature sensors 309 to 312 and the temperature at a hotspot and derives the difference (temperature difference) similarly to step S1302. For example, if the updated temperature information is the information shown in FIG. 18, the temperature (post-correction temperature) at the area (4,5) in which the temperature sensor 309 is located is 52° C. (temperature information 1811), and the temperature (post-correction temperature) at the area (7,7) corresponding to the hotspot is 64° C. (temperature information 1812). In this case, 12° C. is derived as the temperature difference.

Following step S1703, in step S1704, the thermal offset value to be used for the refresh operation is set with respect to the SDRAM 301 by the CPU 101, similarly to step S1303, according to the temperature difference that was derived in step S1703, and then the processing ends. On the other hand, if the processing has moved from step S1702 to step S1704, the CPU 101 sets the thermal offset value to the largest value among possible values ("1" in the case of FIG. 14), regardless of the updated temperature information, and then the processing ends.

<Setting of Self-Refresh Mode>

The processing for setting the self-refresh mode of the present embodiment is similar to that of the first embodiment (FIG. 15).

As described above, in the present embodiment, the difference between the actual temperature and the temperature indicated by the updated temperature information in the areas in which the temperature sensors 309 to 312 are located is calculated, and the correction of the updated temperature information, or the setting of the thermal offset value is performed according to the difference that was calculated. Specifically, if the calculated difference is at or below the predetermined threshold value, the updated temperature information is corrected according to that difference. Thus, it is possible to appropriately correct for the deviation that appears in the updated temperature information and more accurately perform the setting of the thermal offset value. Also, if the calculated difference exceeds the predetermined threshold value, the thermal offset value is mandatorily set to the largest value among the possible values. Thus, even in the case where a large deviation occurs in the updated temperature information, it is possible to prevent the loss of stored content in the memory chip caused by hotspots to the greatest extent possible.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-245635, filed Nov. 7, 2012, which is hereby incorporated by reference herein in its entirety.

The invention claimed is:

1. An information processing apparatus comprising:
a wide IO memory device stacked on an SoC (System on Chip);
at least one CPU configured to perform the steps of:
acquiring, from a temperature sensor provided in a memory chip that is included in the wide IO memory device, sensor information that indicates a temperature of the memory chip at the location of the temperature sensor;
generating temperature distribution information that indicates a current temperature distribution in the memory chip, based on the sensor information acquired by the acquisition and predetermined temperature information that includes information that was generated using an analysis executed in advance and is related to the temperature distribution in the memory chip, the predetermined temperature information corresponding to operating states of the SoC die and the wide IO memory device; and
setting a thermal offset value to be used for a refresh operation of the memory chip in accordance with a difference between a first temperature at a location at which the temperature is the highest in the memory chip and a second temperature at the location of the temperature sensor, wherein the first and second temperatures are included in the temperature distribution indicated by the temperature distribution information.

2. The information processing apparatus according to claim 1,
wherein the generation, using the temperature at the location of the temperature sensor indicated by the sensor information as a reference, generates the temperature distribution information based on the predetermined temperature information that corresponds to the operating states of the SoC die and the wide IO memory device.

3. The information processing apparatus according to claim 1,
wherein the predetermined temperature information includes information that indicates change with time in the temperature distribution in the memory chip and corresponds to the operating states of the SoC die and the wide IO memory device, after the SoC die has started a specific operation; and
the generation specifies elapsed time since the SoC die started the specific operation by comparing change in temperature in the memory chip in accordance with the specific operation at the location of the temperature sensor indicated by the predetermined temperature information, and the temperature indicated by the sensor information, and generates information indicating the temperature distribution in the memory chip corresponding to the elapsed time as the temperature distribution information.

4. The information processing apparatus according to claim 3,
wherein the generation specifies, as the elapsed time, a period of time from when the SoC die started the specific operation until when the temperature of the memory chip at the location of the temperature sensor changes to the temperature indicated by the sensor information in accordance with the specific operation.

5. The information processing apparatus according to claim 3,
wherein the predetermined temperature information includes information indicating the temperature at a plurality of different points in time after the SoC die started the specific operation with respect to areas obtained by dividing the memory chip into a plurality of areas, and
for each of the areas, the generation calculates an approximate curve that indicates change in temperature according to the specific operation of the SoC die, based on the temperatures at the plurality of points in time that are included in the predetermined temperature information, and specifies the elapsed time based on the approximate curve calculated for an area in which the temperature sensor is included.

6. The information processing apparatus according to claim 5,
wherein the generation, based on the plurality of approximate curves corresponding to the plurality of areas, generates information indicating the temperature distribution in the memory chip corresponding to the elapsed time as the temperature distribution information.

7. The information processing apparatus according to claim 1, wherein the at least one CPU is further configured to
update the generated temperature distribution information at an update interval set in advance, based on the predetermined temperature information,
wherein the setting periodically executes setting of the thermal offset value based on the temperature distribution information that was generated by the generation or that was updated by the updating.

8. The information processing apparatus according to claim 7,
wherein the updating updates the temperature distribution information based on the predetermined temperature information corresponding to the operating states of the SoC die and the wide IO memory device using the temperature at the location of the temperature sensor included in the temperature distribution information that was generated by the generation or that was most recently updated as a reference.

9. The information processing apparatus according to claim 7,
wherein if the difference between the temperature at the location of the temperature sensor included in the temperature distribution information that was updated by the updating, and the temperature indicated by the sensor information exceeds a predetermined threshold value, the setting sets the thermal offset value to a largest value among possible values.

10. The information processing apparatus according to claim 9, wherein the at least one CPU is further configured to,
if the difference between the temperature at the location of the temperature sensor included in the temperature distribution information that was updated by the updating and the temperature indicated by the sensor information is at or below the predetermined threshold value, correct the temperature distribution indicated by the temperature distribution information in accordance with the difference.

11. The information processing apparatus according to claim 1,
 wherein the setting sets the thermal offset value to a higher value as the difference increases between the second temperature at the location of the temperature sensor and the first temperature at a location at which the temperature is the highest in the memory chip, wherein the first and second temperatures are included in the temperature distribution indicated by the temperature distribution information.

12. The information processing apparatus according to claim 1,
 wherein the memory chip is used in a state of being divided into a plurality of chip areas corresponding to a plurality of memory channels included in the wide TO memory device, a temperature sensor being provided individually in each of the chip areas,
 the generation generates the temperature distribution information individually for each of the plurality of chip areas, and
 the setting sets the thermal offset value individually for each of the plurality of chip areas.

13. The information processing apparatus according to claim 1,
 wherein the predetermined temperature information is generated individually in advance in accordance with individual operating states of the SoC die and the wide IO memory device.

14. The information processing apparatus according to claim 1,
 wherein the temperature distribution in the memory chip is a distribution of temperatures at a surface of the memory chip.

15. The information processing apparatus according to claim 1,
 wherein in a case of causing the memory chip to shift to a self-refresh state, the CPU causes the memory chip to execute the refresh operation at a refresh cycle that corresponds to the thermal offset value set by the setting.

16. The information processing apparatus according to claim 1,
 wherein the generation initializes and newly generates the temperature distribution information each time the information processing apparatus is activated from a powered-off state.

17. A method for controlling an information processing apparatus including a wide 10 memory device stacked on an SoC (System on Chip) die that includes a CPU, the method comprises:
 acquiring, from a temperature sensor provided in a memory chip that is included in the wide 10 memory device, sensor information that indicates a temperature of the memory chip at the location of the temperature sensor;
 generating temperature distribution information indicating a current temperature distribution in the memory chip based on sensor information acquired in the acquiring step and predetermined temperature information that includes information that was generated using an analysis executed in advance and is related to the temperature distribution in the memory chip, the predetermined temperature information corresponding to operating states of the SoC die and the wide 10 memory device; and
 setting a thermal offset value to be used for a refresh operation of the memory chip in accordance with a difference between a first temperature at a location at which the temperature is the highest in the memory chip and a second temperature at the location of the temperature sensor, wherein the first and second temperatures are included in the temperature distribution indicated by the temperature distribution information.

18. A non-transitory computer readable storage medium storing a computer program for causing a computer to execute steps of a method for controlling an information processing apparatus including a wide IQ memory device stacked on an SoC (System on Chip) die that includes a CPU, the method comprising steps of:
 acquiring, from a temperature sensor provided in a memory chip that is included in the wide IQ memory device, sensor information that indicates a temperature of the memory chip at the location of the temperature sensor:
 generating temperature distribution information indicating a current temperature distribution in the memory chip based on sensor information acquired in the acquiring step and predetermined temperature information that includes information that was generated using an analysis executed in advance and is related to the temperature distribution in the memory chip, the predetermined temperature information corresponding to operating states of the SoC die and the wide IQ memory device: and
 setting a thermal offset value to be used for a refresh operation of the memory chip in accordance with a difference between a first temperature at a location at which the temperature is the highest in the memory chip and a second temperature at the location of the temperature sensor, wherein the first and second temperatures are included in the temperature distribution indicated by the temperature distribution information.

* * * * *